United States Patent [19]
Agahi et al.

[11] Patent Number: 6,144,054
[45] Date of Patent: Nov. 7, 2000

[54] DRAM CELL HAVING AN ANNULAR SIGNAL TRANSFER REGION

[75] Inventors: Farid Agahi, Austin, Tex.; Louis L. Hsu, Fishkill; Jack A. Mandelman, Stormville, both of N.Y.

[73] Assignee: International Business Machines Corporation, Armonk, N.Y.

[21] Appl. No.: 09/205,934

[22] Filed: Dec. 4, 1998

[51] Int. Cl.[7] .......................... H01L 27/108; H01L 29/76; H01L 31/119; H01L 29/94

[52] U.S. Cl. .......................... 257/296; 257/301; 257/302

[58] Field of Search .......................... 257/295, 296–310; 438/243–253; 361/302–305

[56] References Cited

U.S. PATENT DOCUMENTS

| | | |
|---|---|---|
| 4,833,516 | 5/1989 | Hwang et al. . |
| 4,890,145 | 12/1989 | Malhi . |
| 4,914,628 | 4/1990 | Nishimura . |
| 5,008,214 | 4/1991 | Redwine . |
| 5,177,576 | 1/1993 | Kimura et al. . |
| 5,225,697 | 7/1993 | Malhi et al. . |

OTHER PUBLICATIONS

J. A. Mandelman et al., "Floating–Body Concerns For SOI Dynamic Random Access Memory (DRAM)," IEEE International SOI Conference Proceedings, pp. 136–137 (Oct. 1996).

Primary Examiner—Minh Loan Tran
Assistant Examiner—Cuong Q Nguyen
Attorney, Agent, or Firm—Ratner & Prestia

[57] ABSTRACT

A memory device formed in a substrate having a trench with side walls formed in the substrate. The device includes a bit line conductor and a word line conductor. A signal storage node has a first electrode, a second electrode formed within the trench, and a node dielectric formed between the first and second electrodes. A signal transfer device has: (i) an annular signal transfer region with an outer surface adjacent the side walls of the trench, an inner surface, a first end, and a second end; (ii) a first diffusion region coupling the first end of the signal transfer region to the. second electrode of the signal storage node; (iii) a second diffusion region coupling the second end of the signal transfer region to the bit line conductor; (iv) a gate insulator coating the inner surface of the signal transfer region; and (v) a gate conductor coating the gate insulator and coupled to the word line. A conductive connecting member couples the signal transfer region to a reference voltage to reduce floating body effects.

13 Claims, 19 Drawing Sheets

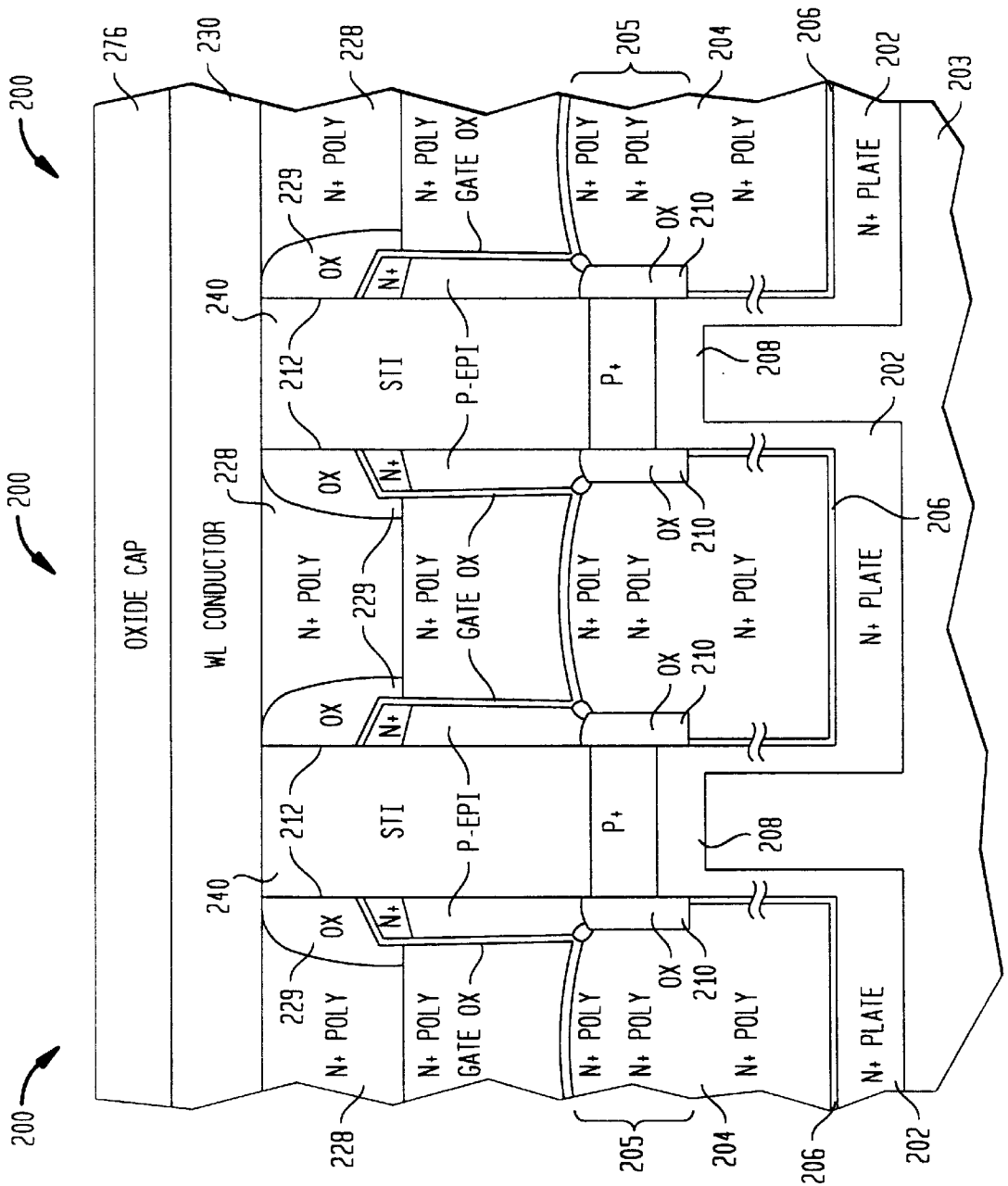

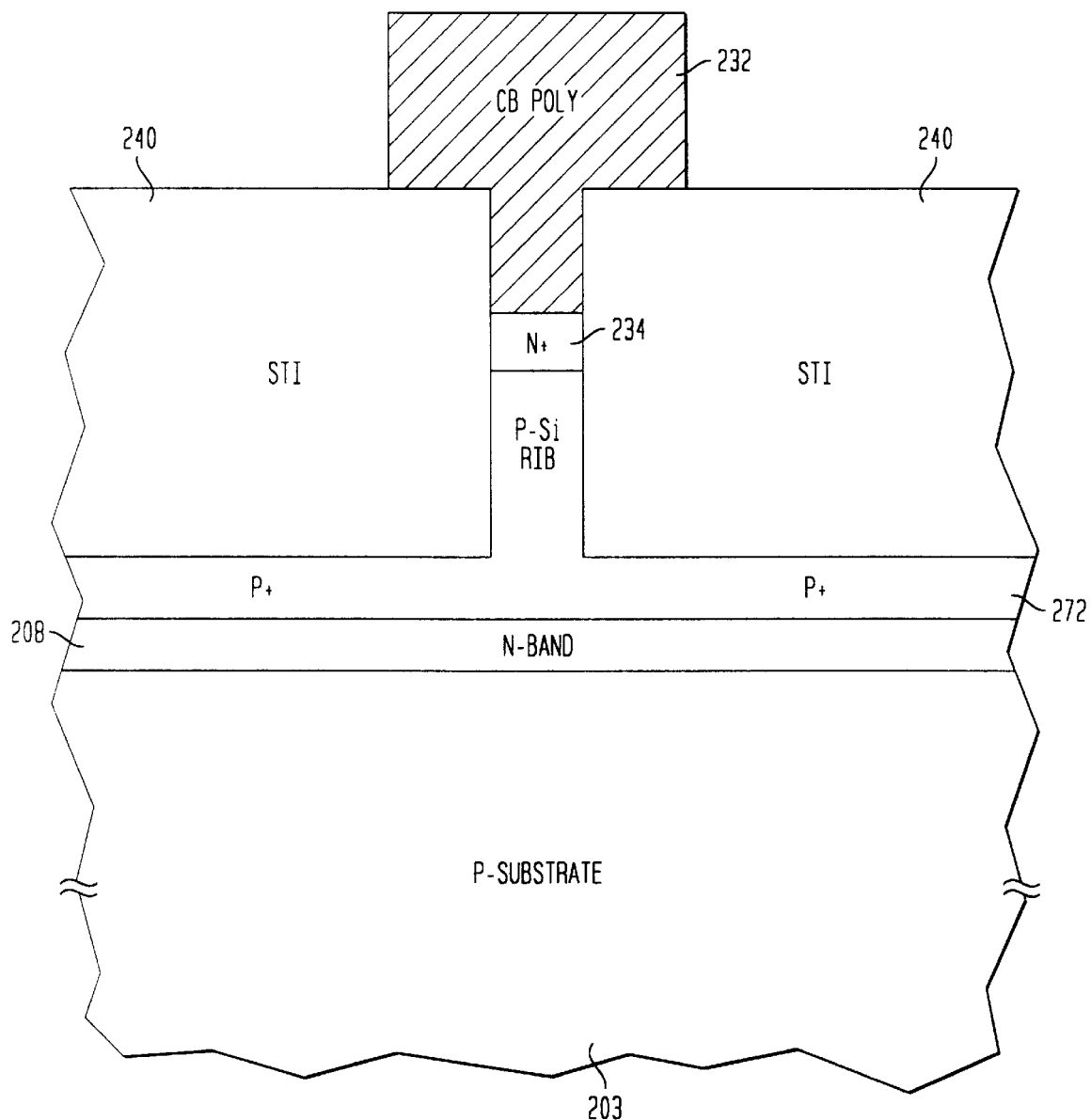

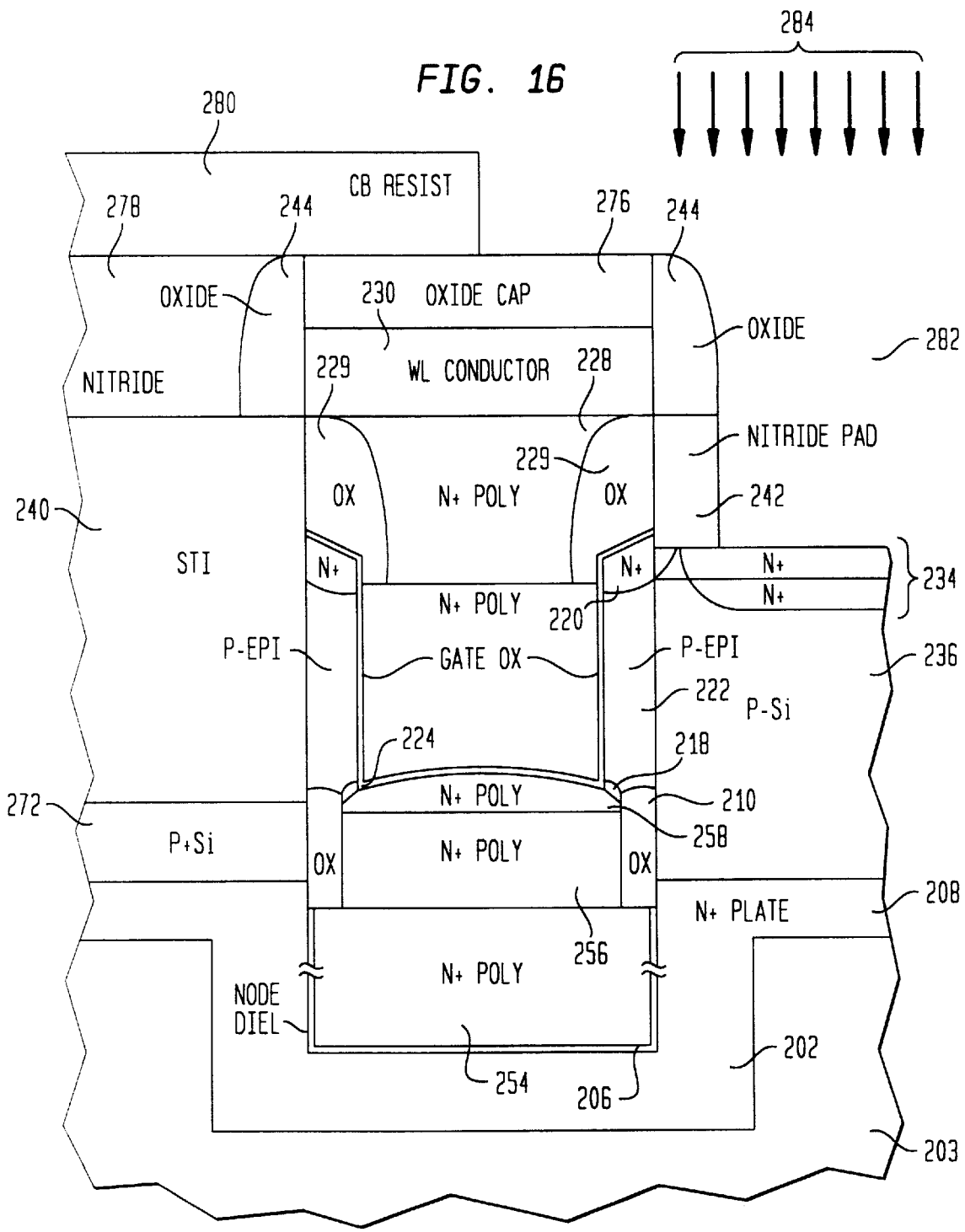

DRAM CELL HAVING AN ANNULAR SIGNAL TRANSFER REGION

TECHNICAL FIELD

The present invention relates generally to a dynamic random access memory (DRAM) device and, more particularly, to a DRAM device having an annular signal transfer region.

BACKGROUND OF THE INVENTION

In the semiconductor industry, there is an ever-increasing desire to increase memory density and performance. These goals are often achieved by scaling dynamic random access memory (DRAM) devices to smaller dimensions and operating voltages.

A DRAM cell may include a horizontal, planar, MOSFET (metal oxide semiconductor field effect transistor) coupled to a deep trench storage capacitor by a buried strap. Such a DRAM cell may occupy a substrate surface area of $8F^2$ (where F is a minimum lithographic dimension) and may include a trench capacitor having a 1F×2F cross section. As the surface area of the $8F^2$ DRAM cell is reduced to $7F^2$, the cross section of the trench capacitor is typically reduced to 1F×1F. Compared to the $8F^2$ design (e.g., a merged-isolation and node-in-trench, or MINT, design), the $7F^2$ design is more susceptible to large threshold voltage ($V_t$) variations mainly due to GC-DT (gate conductor-deep trench) overlay tolerance.

In the above example, there is a factor of two reduction in trench cross-section area. There may be an additional factor of two decrease resulting from the generation-to-generation ground rule scaling. For example, when the generation-to-generation ground rule scaling reduces the minimum feature size by a factor of 0.7, the 1F×2F=$2F^2$ trench capacitor is first reduced to 1F×1F=$1F^2$ and then further reduced to 0.7F×0.7F=$0.49F^2$. Such scaling may result in reduced storage capacitance, reduced operating voltages, non-scalability of the threshold voltage ($V_t$), and large $V_t$ variations. The compounded effects of these factors may cause a decrease in sensing reliability and immunity to noise and soft errors.

The reduction in storage capacitance is directly caused by the scaling of the DRAM cell to a smaller dimension because a smaller capacitor can store less charge. In addition, storage capacitance is also reduced because capacitor node dielectric thickness may not be proportionately scaled due to reliability considerations.

Vertical memory devices have been proposed to increase memory density without reducing storage capacitance. A vertical memory device may be formed by having a signal storage node and a signal transfer device formed in a trench. FIG. 1 illustrates a vertical memory device 100 formed in a trench within a substrate 10 as disclosed by Kimura et al. in U.S. Pat. No. 5,177,576.

The signal storage node of the memory device 100 shown in FIG. 1 has both a first electrode and a second electrode formed within the trench. The first electrode 11 is bound by insulating layers 9 and 14. The second electrode 15 is formed on the interior side of insulating layer 14. The first electrode 11 is coupled to the first electrode of other devices by diffusion layer 12.

The second electrode 15 of the signal storage node is coupled to the bit lines 20, 28 by a signal transfer device. The signal transfer device includes diffusion regions 23, 24 and a channel area 22. The channel area 22 is bound by an insulation film 19 along the side wall of the trench and by an insulating layer 25 on the interior side of the trench. The channel area 22 of the memory device 100 in FIG. 1 is controlled by the word line 30 which is coupled to the gate electrode 26. The bottom of the gate electrode 26 is isolated from the signal storage node by an insulator 251.

The memory device 100 illustrated in FIG. 1 may not be operable for long retention-time DRAM applications due to floating-body (floating-channel) effects. Floating-body effects are recognized in silicon-on-insulator (SOI) technology as being highly detrimental for long retention-time DRAM applications. Although the memory device 100 in FIG. 1 does not use SOI technology, the geometry of the cell results in a design which is analogous to a floating body in SOI technology because the channel area 22 is not coupled to a voltage reference. For example, because the body-charge is isolated from the substrate 10, the body-charge in the channel area 22 may vary depending on the operating history of the signal transfer device. This arrangement may result in dynamic charge leakage from the signal storage node which may prevent reliable operation of memory device 100 for long retention-time applications.

To overcome the shortcomings of conventional DRAM devices, a new DRAM device is provided. An object of the present invention is to provide a DRAM device that has improved charge retention characteristics. A related object is to provide a process of manufacturing such a DRAM device. Another object is to provide a DRAM device that occupies a reduced semiconductor surface area while maintaining sufficient storage node capacitance. Another object is to provide a DRAM device having a signal transfer device with a large width-to-length ratio. It is still another object to provide a DRAM device having a signal transfer device with an annular signal transfer region. Yet another object is to provide a DRAM device having a bit line conductor elevated above the word lines. Another object of the present invention is to provide a DRAM device capable of fully depleted operation for near ideal sub-$V_t$ slope and near zero substrate sensitivity.

SUMMARY OF THE INVENTION

To achieve these and other objects, and in view of its purposes, the present invention provides a memory device formed in a substrate having a trench with side walls formed in the substrate. The device includes a bit line conductor and a word line conductor. A signal storage node has a first electrode, a second electrode formed within the trench, and a node dielectric formed between the first and second electrodes. A signal transfer device has: (i) an annular signal transfer region with an outer surface adjacent the side walls of the trench, an inner surface, a first end, and a second end; (ii) a first diffusion region coupling the first end of the signal transfer region to the second electrode of the signal storage node; (iii) a second diffusion region coupling the second end of the signal transfer region to the bit line conductor; (iv) a gate insulator coating the inner surface of the signal transfer region; and (v) a gate conductor coating the gate insulator region and coupled to the word line. A conductive coupling member couples a portion of the outer surface of the signal transfer region to a reference potential.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 2C is a cross-sectional view of the memory devices shown in FIG. 2A taken along the line 2C—2C;

FIG. 2D is a cross-sectional view of the memory devices shown in FIG. 2A taken along the line 2D—2D;

FIGS. 13–16 are cross-sectional views illustrating still another alternative process of manufacture according to the present invention.

DETAILED DESCRIPTION OF THE INVENTION

Device

Figure 1:
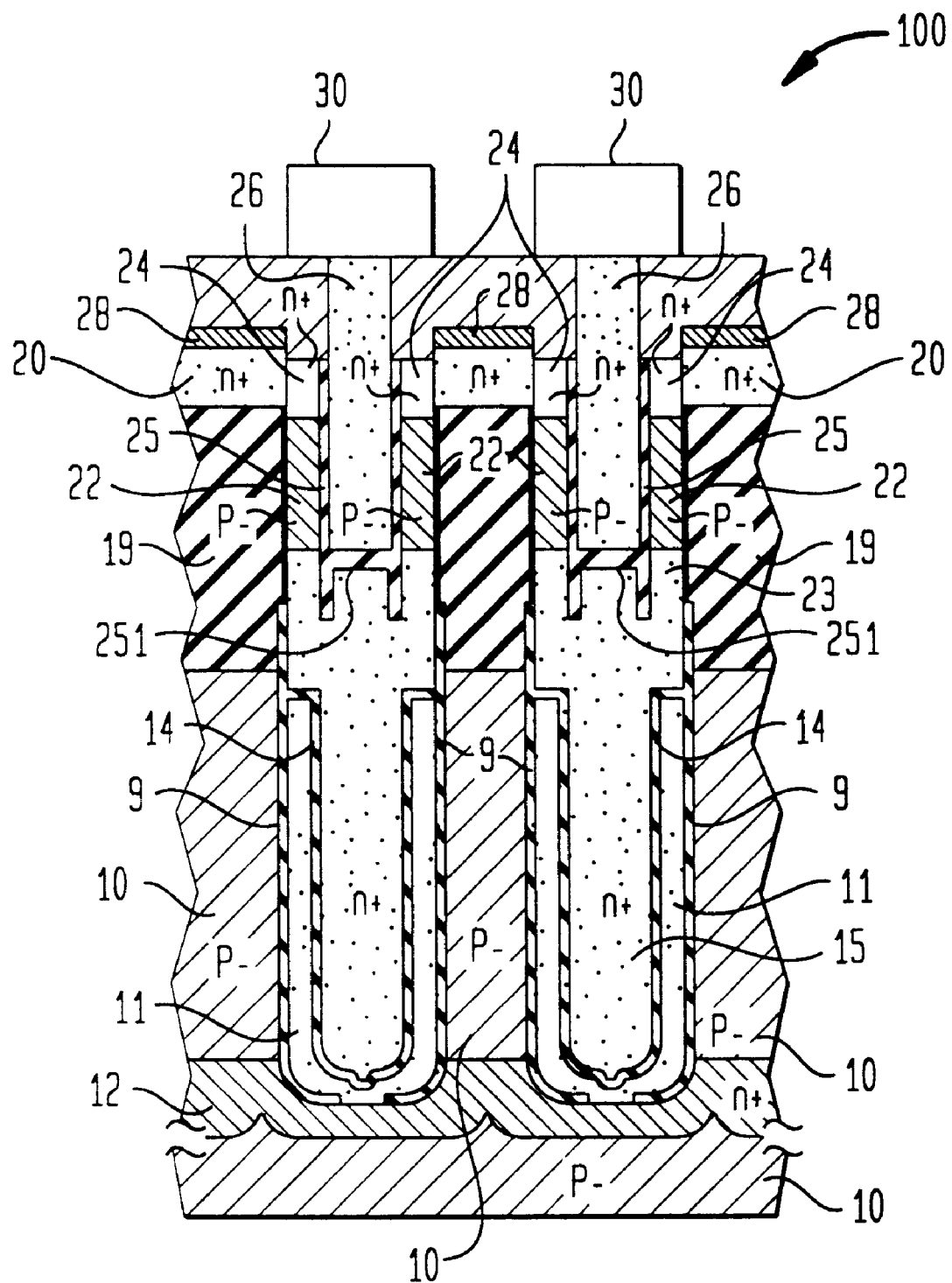
FIG. 1 is a cross-sectional view of a vertical memory device.
Figure 2A:
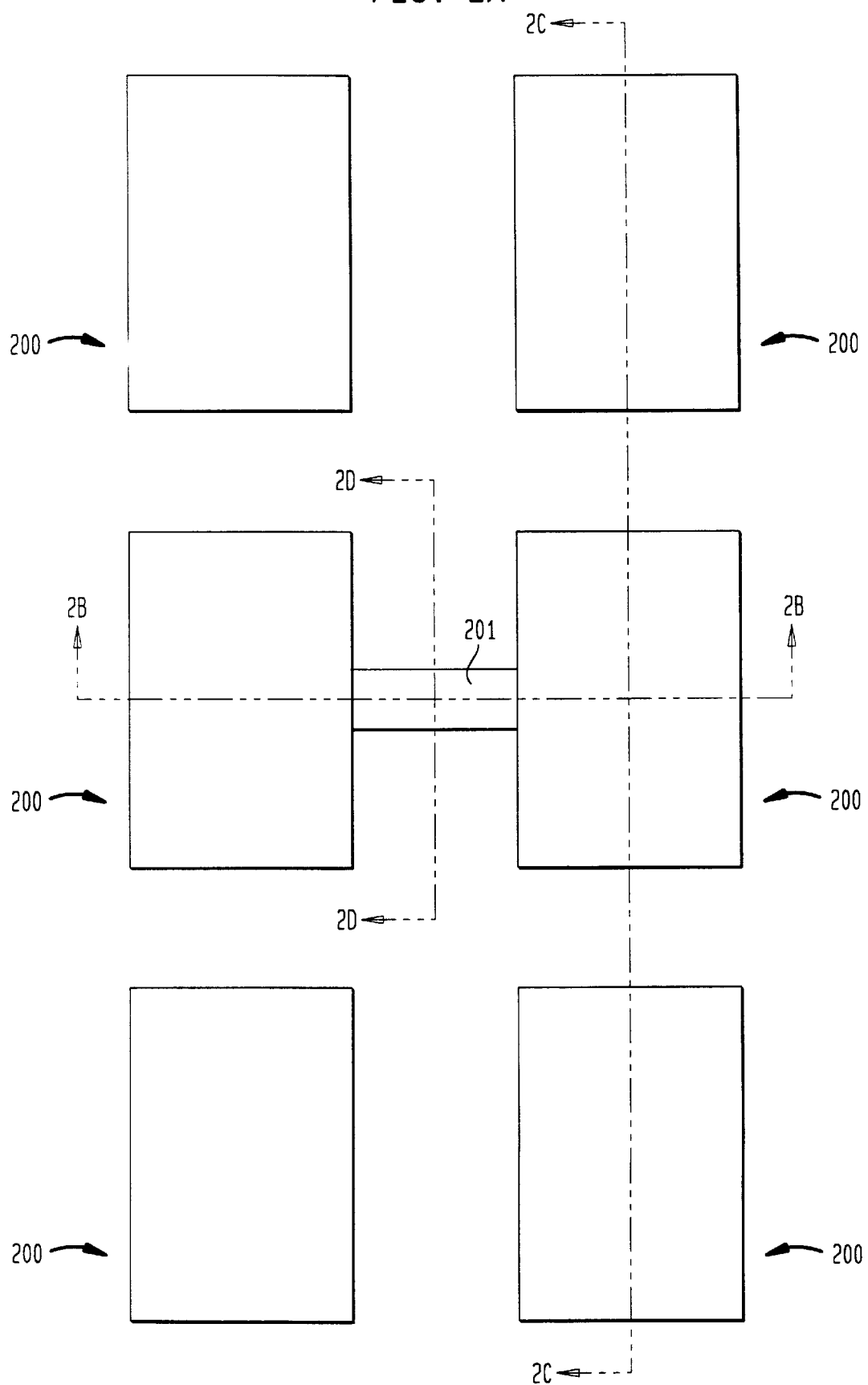
FIG. 2A is a top view of memory devices according to an exemplary embodiment of the present invention.

Referring now to the drawing, in which like reference numbers refer to like elements throughout, FIG. 2A is a top view of a memory device 200 according to an exemplary embodiment of the present invention. In the exemplary embodiment shown in FIG. 2A, two memory devices 200 are coupled to each other through a coupling region 201. Cross sections of the exemplary memory devices 200 taken along lines 2B—2B, 2C—2C, and 2D—2D are illustrated in FIGS. 2B, 2C, and 2D, respectively.

Figure 2B:
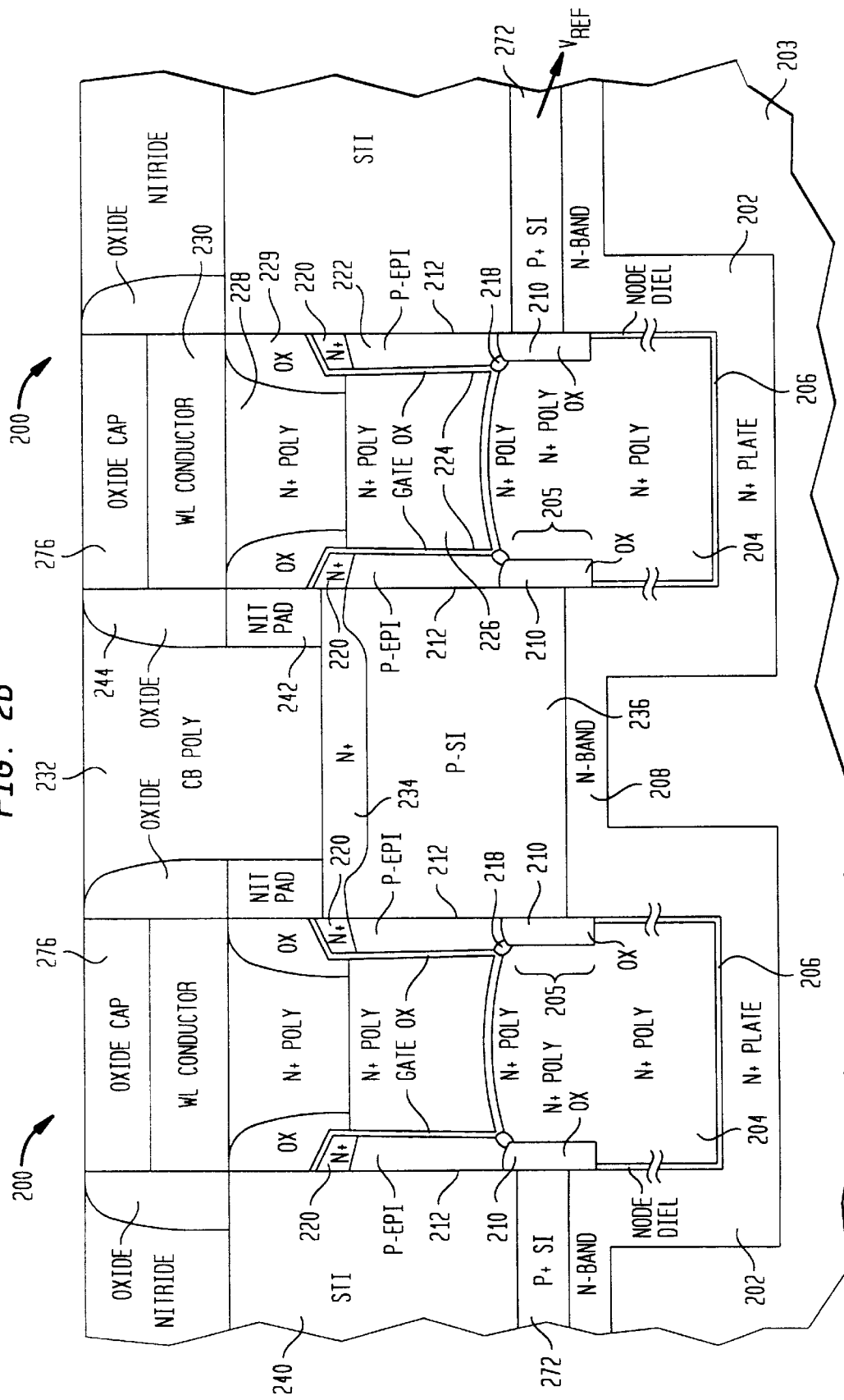
FIG. 2B is a cross-sectional view of the memory devices shown in FIG. 2A taken along the line 2B—2B.

As shown in FIGS. 2B, 2C, and 2D, the exemplary memory device 200 is formed using a deep trench (DT) having side walls 212. The DT is formed in a p-type silicon substrate 203. As known to those skilled in the art, the teachings of the present invention may also be applied to forming a memory device in an n-type silicon substrate or using other semiconductor materials. Thus, the present invention is not limited to the particular materials used in describing the exemplary embodiment.

The signal storage node of the memory device 200 includes a first electrode 202 isolated from a second electrode 204 by a node dielectric 206 and a collar oxide 210. The first electrode 202 of one memory device 200 is coupled to the first electrode 202 of other memory devices 200 by a conductive band 208. As known to those skilled in the art, the process of forming the first electrode 202 may be varied to yield the first electrode 202 of one memory device 200 merging with the first electrode 202 of another memory device 200. When the first electrodes 202 of separate memory devices 200 merge, the conductive band 208 is eliminated. The collar oxide 210 is formed along the side walls 212 of the trench and is adjacent an upper portion 205 of the second electrode 204.

A signal transfer device includes a first diffusion region 218, a second diffusion region 220, and a signal transfer region 222. The first and second diffusion regions 218, 220 are coupled together by the signal transfer region 222. The channel of the signal transfer device is formed in the signal transfer region 222 during memory device 200 operation. The signal transfer region 222 is annular in shape and is formed along the side walls 212 of the trench. In a preferred embodiment, the signal transfer region 222 is an epitaxial silicon region.

In the exemplary embodiment, as shown in FIGS. 2B and 2C, the first diffusion region 218 of the signal transfer device is isolated from the side walls 212 of the trench by the signal transfer region 222 and the collar oxide 210. Thus, the first diffusion region 218 is "tucked" behind the corner of the collar oxide 210. Isolation of the first diffusion region 218 from the side walls 212 of the trench reduces leakage current between the first diffusion region 218 of one memory device 200 and the first diffusion region 218 of another memory device 200.

Figure 5:
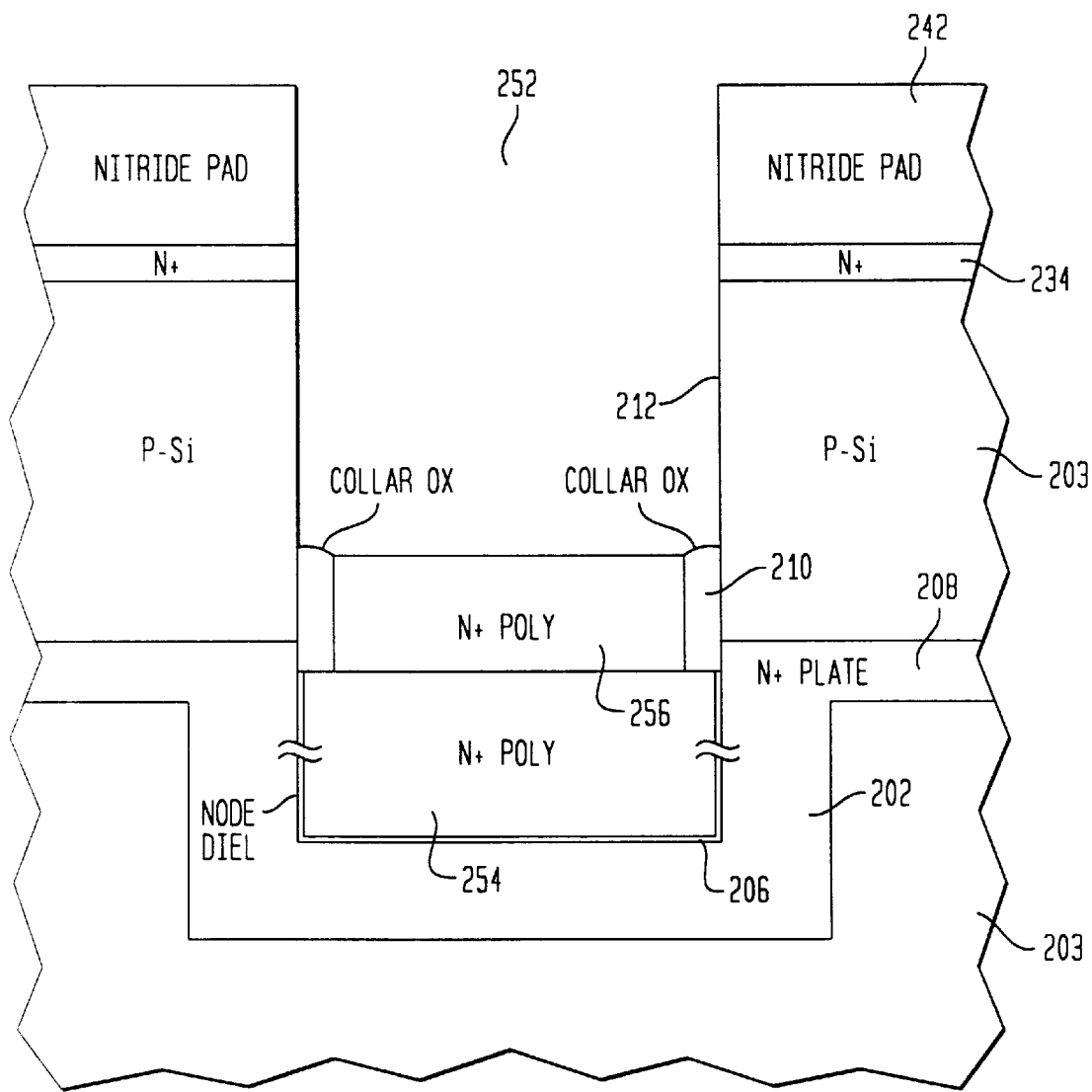

A parasitic MOSFET may be formed along the trench side wall 212 between the first diffusion region 218 (see FIG. 2B) and the conductive band 208 and may be gated by a portion of the second electrode 204 adjacent the collar oxide 210 such as the second conductor 256 (see FIG. 5). The height of the collar oxide 210 is designed to raise the threshold voltage $V_t$ of this parasitic MOSFET. Since the first diffusion region 218 is "tucked" on the inside surface of the annular signal transfer region 222, the effective channel length of the parasitic MOSFET is increased. This configuration allows the height of the collar oxide 210 to be reduced.

The threshold voltage $V_t$ of the parasitic MOSFET is further increased due to the "tucked" positioning of the first diffusion region 218. The channel current of the parasitic MOSFET must take a path around the bend at the interface between the signal transfer region 222 and the substrate 203. Because this path is concave with respect to the second conductor 256 of the parasitic MOSFET, the $V_t$ is further increased.

A gate insulator 224 insulates the signal transfer device from the first gate conductor 226. A word line conductor 230 is coupled to the first gate conductor 226 by a second gate conductor 228. A signal applied to the word is line conductor 230 controls the formation of a channel in the signal transfer region 222. A bit line stud conductor 232 is coupled to the second diffusion region 220 of the signal transfer device by a third diffusion region 234. A signal applied to the bit line conductor 246 (FIG. 2E) is coupled to the memory device 200 through the bit line stud conductor 232. A word line oxide cap 276 covers the word line conductor 230 (FIGS. 2B and 2C).

In this exemplary embodiment, the signal transfer region 222 of one memory device 200 is coupled to the signal transfer region 222 of another memory device 200 by a conductive connecting member 236 to form a linked pair of memory devices 200. The teachings of the present invention may be applied to embodiments having coupling members 236 that couple the signal transfer regions 222 of more than two memory devices 200. The signal transfer-regions 222 of the linked pair of memory devices 200 are coupled to the signal transfer regions 222 of other linked pairs of memory devices 200 by a conductive region 272. In an exemplary embodiment, the conductive region 272 is coupled to a reference voltage $V_{ref}$.

Floating-body effects in a memory device 200 according to the present invention are reduced by coupling the signal transfer region 222 to a reference voltage $V_{ref}$. The conductive path from the signal transfer region 222 through the conductive connecting member 236 and the conductive region 272 to a reference voltage $V_{ref}$ allows the charge in the signal transfer region 222 to rapidly equilibrate. This rapid equilibration reduces dynamic data retention problems caused by floating-body effects.

Figure 2E:
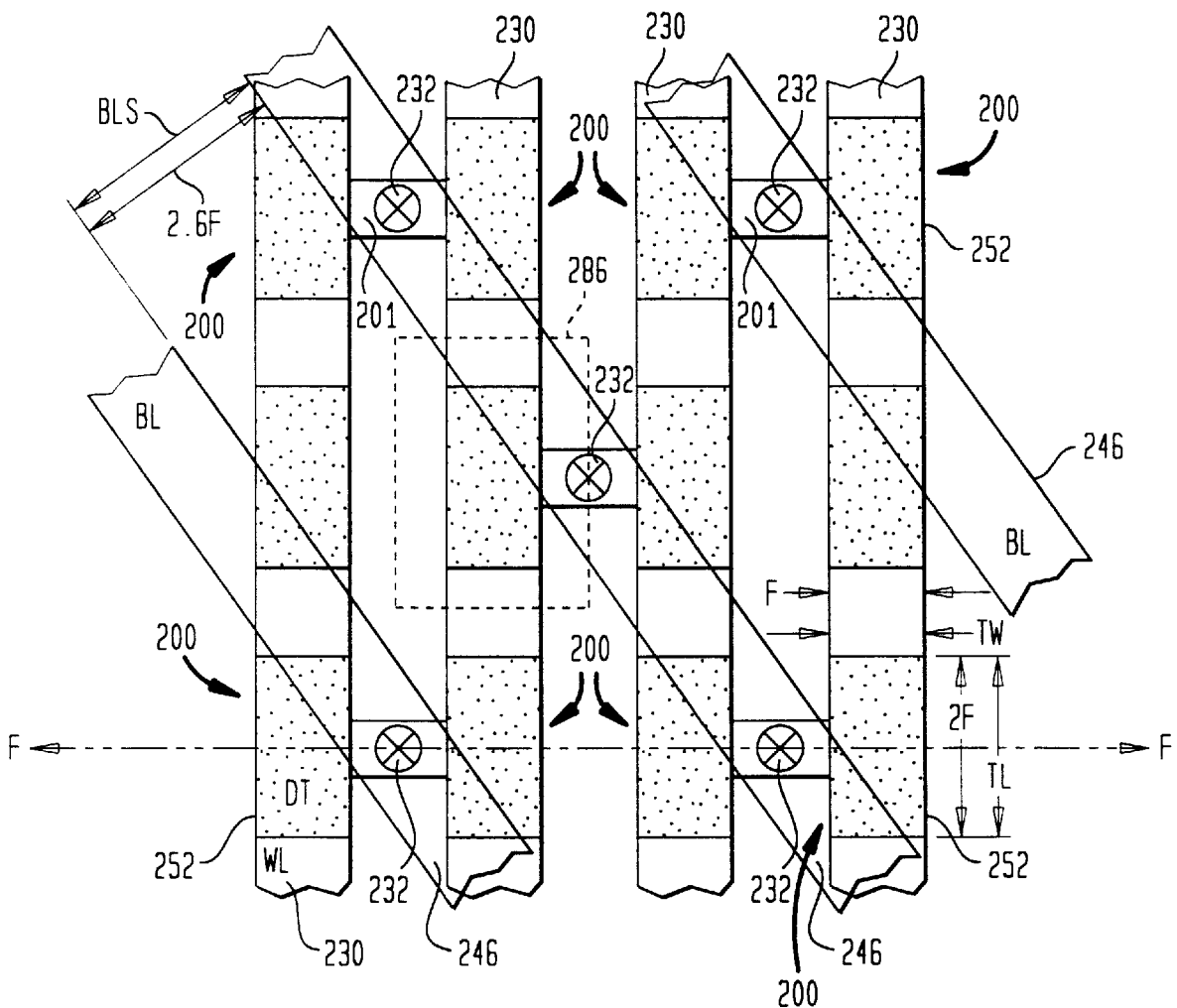
FIG. 2E is a top view of memory devices according to an exemplary embodiment of the present invention.

FIG. 2E shows a top view of an array of memory devices 200 according to an exemplary embodiment of the present invention. Each memory device 200 in FIG. 2E shares a bit line stud conductor 232 with another memory device 200. The bit line stud conductors 232 are coupled to a bit line signal (not shown) by a bit line conductor 246.

In the exemplary embodiment shown in FIG. 2E, the bit line conductor 246 is patterned to run obliquely to the major axis F—F of the memory devices 200. This arrangement allows a very wide bit line conductor 246 to bit line conductor 246 spacing BLS. In the exemplary embodiment shown in FIG. 2E, the bit line spacing BLS is 2.6F. Having a wider bit line spacing BLS minimizes noise that may be coupled between bit line conductors 246.

The trench 252 (FIG. 2E) formed in the substrate 203 has a trench width TW and a trench length TL. In the exemplary embodiment shown in FIG. 2E, each trench 252 has a size TW×TL equal to 1F×2F and each DRAM cell occupies a substrate 203 surface area equal to $6F^2$ as defined by boundary 286.

Each memory device 200 is insulated from adjacent memory devices 200 by a shallow trench isolation (STI) region 240 (FIGS. 2B, 2C, and 2D). The bit line stud conductor 232 is bound by an oxide spacer 244 formed above a nitride layer 242. The second gate conductor 228 is bound by an oxide spacer 229.

Process of Manufacture

A process of manufacturing a memory device 200 according to the present invention is described with reference to FIGS. 3–16. Each of FIGS. 3–10 and 13–16 correspond to cross sections of a memory device 200 taken along line 2B—2B of FIG. 2A.

Figure 3:
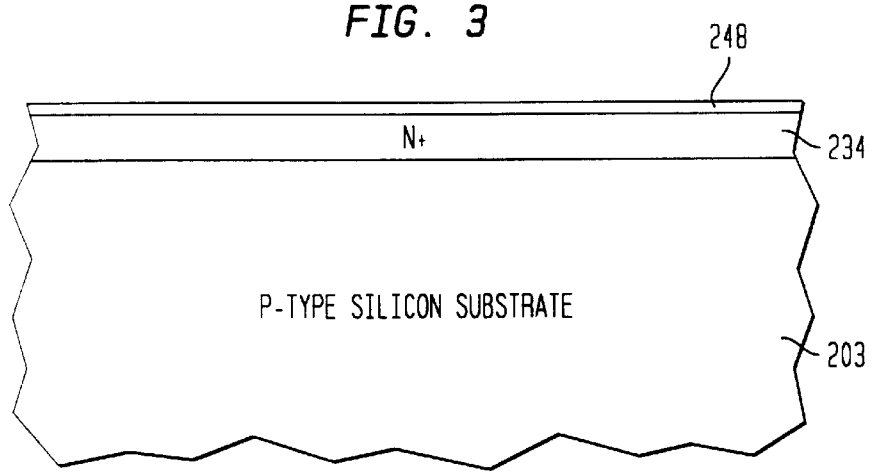
FIGS. 3–10 are cross-sectional views illustrating a process of manufacture according to an exemplary embodiment of the present invention.

As shown in FIG. 3, a sacrificial oxide layer 248 is grown on a p-type silicon substrate 203. The top surface of the substrate 203 is then implanted with a dopant to form an N+ third diffusion region 234 below the sacrificial oxide layer 248. As known to those skilled in the art, a non-critical mask may be used to isolate the implant to areas of a chip where memory devices 200 are to be formed. As described in subsequent steps of the process of manufacture, the implanted region is used to form the third diffusion region 234 (FIG. 2B).

Figure 4:
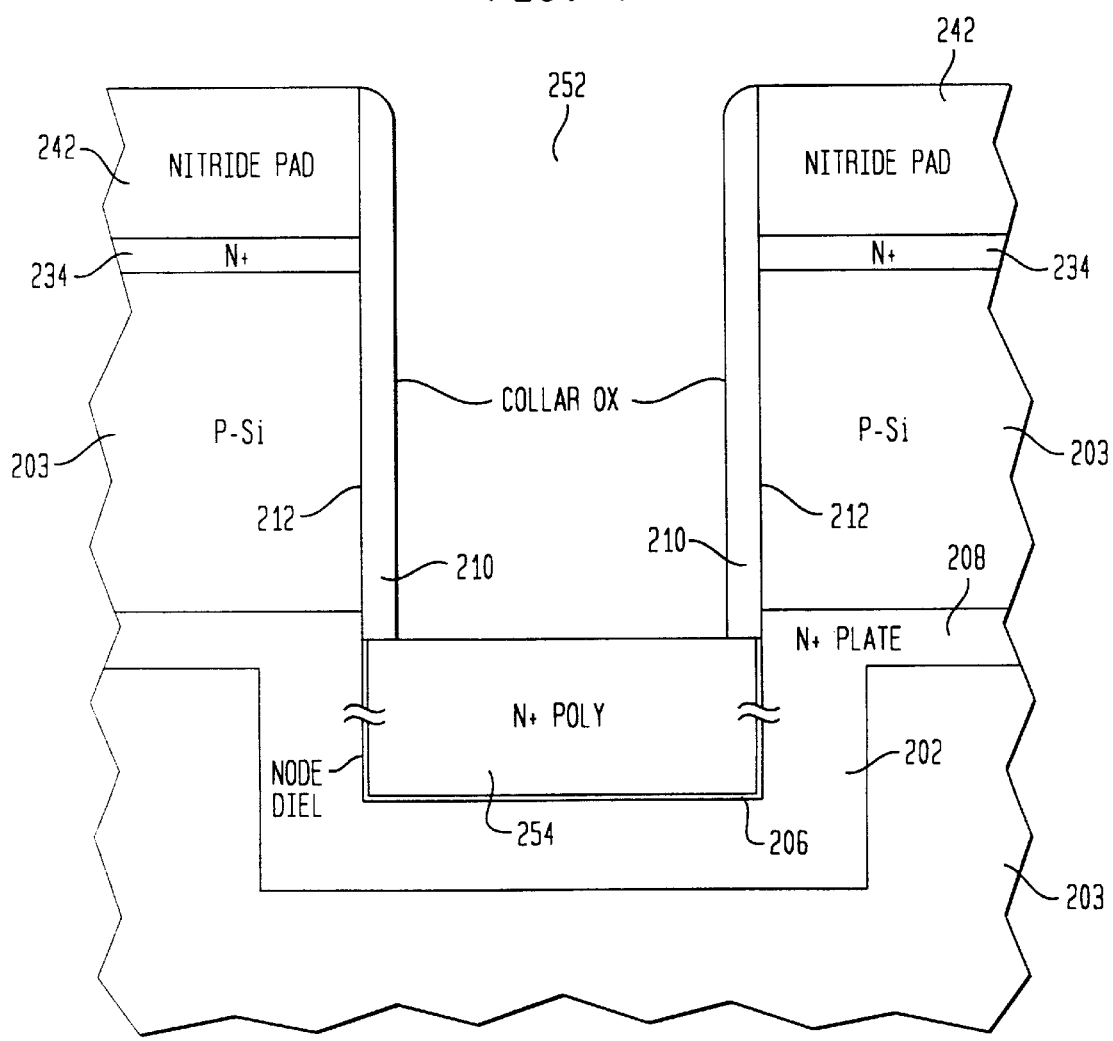

As shown in FIG. 4, the sacrificial oxide layer 248 is removed and a nitride layer 242 (or nitride pad) is formed over the exposed surface of the third diffusion region 234. In an exemplary embodiment, the sacrificial oxide layer 248 is not removed and the nitride layer 242 is formed over the exposed surface of the sacrificial oxide layer 248. A trench 252 having side walls 212 is then formed in the substrate 203, by etching, for example. The nitride layer 242 protects regions of the substrate 203 outside of the trench 252 from further processing steps.

As with standard trench storage DRAM processing, a DT mask is used to pattern the pad stack. In an exemplary embodiment where the sacrificial oxide layer 248 is not removed, the pad stack includes the sacrificial oxide layer 248 and the nitride layer 242.

A signal storage node is then formed in the bottom of the trench 252. The first electrode 202 of the signal storage node is formed in the substrate 203 adjacent a bottom portion of the trench 252. As known to those skilled in the art, the first electrode 202 may be formed by depositing a layer of doping source material into the bottom portion of the trench 252, causing out-diffusion (by annealing, for example) of the diffusable element in the layer of doping source material into the substrate 203, and then removing the doping source material.

The conductive band 208 couples the first electrodes 202 of adjacent memory devices 200. The conductive band 208 may be formed by implanting to form a deep N+ layer in the device as shown in FIG. 3 before the pad nitride layer 242 is formed. For example, an implant of phosphorus at an energy level of 1.5–2.0 MeV may be performed to form a conductive band 208 having a doping dose of about $1.5–3.0×10^{13}$ $cm^{-2}$. As known to those skilled in the art, the process of forming the first electrode 202 may be varied to result in the first electrode 202 of one memory device 200 merging with the first electrode 202 of another memory device 200. When the first electrodes 202 merge, the conductive band 208 is eliminated.

The node dielectric 206 such as a composite nitride-oxide layer, for example, is then formed in a bottom portion of the trench 252. The trench 252 is filled with a first conductor 254, such as N+ polysilicon, and planarized to the top of the nitride layer 242. The first conductor 254 is recessed to a level below the top surface of the substrate 203 to allow sufficient depth within the trench 252 to form a signal transfer device.

The collar oxide 210 is then formed along the side walls 212 of the trench 252. The collar oxide 210 may be formed by depositing oxide into the trench 252, by chemical vapor deposition (CVD), for example. Reactive ion etching (RIE) may then be used to etch the oxide from a central portion of the trench 252 to retain the collar oxide 210 along the side walls 212 of the trench 252.

As shown in FIG. 5, the second conductor 256 is deposited into the trench 252. The second conductor 256 is planarized to the top surface of the nitride layer 242, and then recessed. In an exemplary embodiment, the second conductor 256 is recessed to a depth approximately 0.5 $\mu$m above the top of the first conductor 254. The exposed collar oxide 210 is then removed with an isotropic etch.

Figure 6:
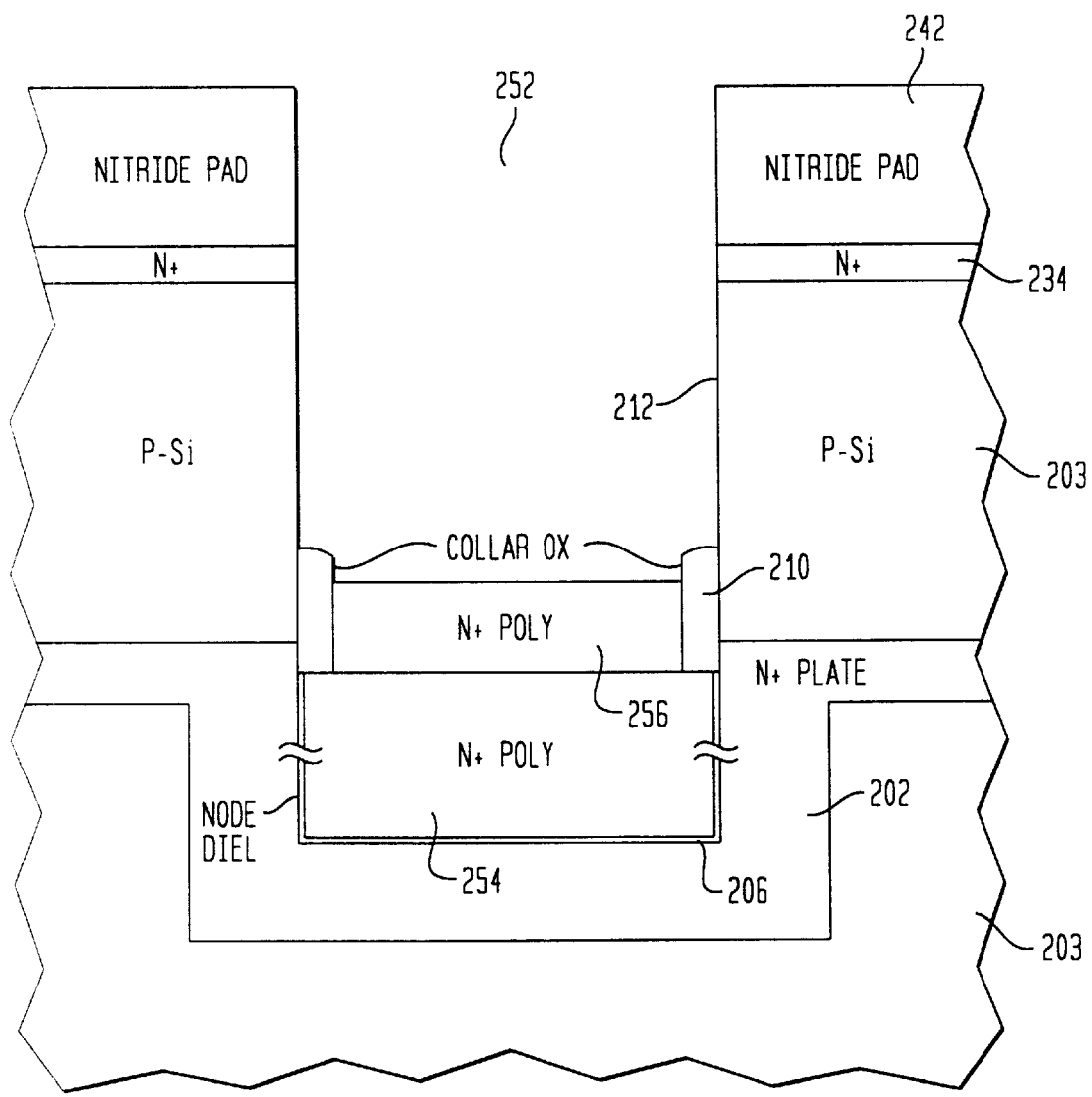

As shown in FIG. 6, the top of the second conductor 256 is then recessed below the top of the remaining collar oxide 210. In an exemplary embodiment, the recessed distance is approximately equal to the thickness of the signal transfer region 222, which is subsequently formed along the side walls 212 of the trench 252. By recessing the second conductor 256 below the collar oxide 210, the first diffusion region 218 (subsequently formed) can be substantially recessed behind the collar oxide 210. This configuration provides improved isolation between a first diffusion region 218 of one memory device 200 and a first diffusion region 218 of another memory device 200. A configuration in which the first diffusion region 218 is recessed behind the collar oxide 210 improves isolation because the distance between the first diffusion regions 218 of adjacent memory devices 200 is increased and because the field lines are partially shielded by the collar oxide 210.

Figure 7:
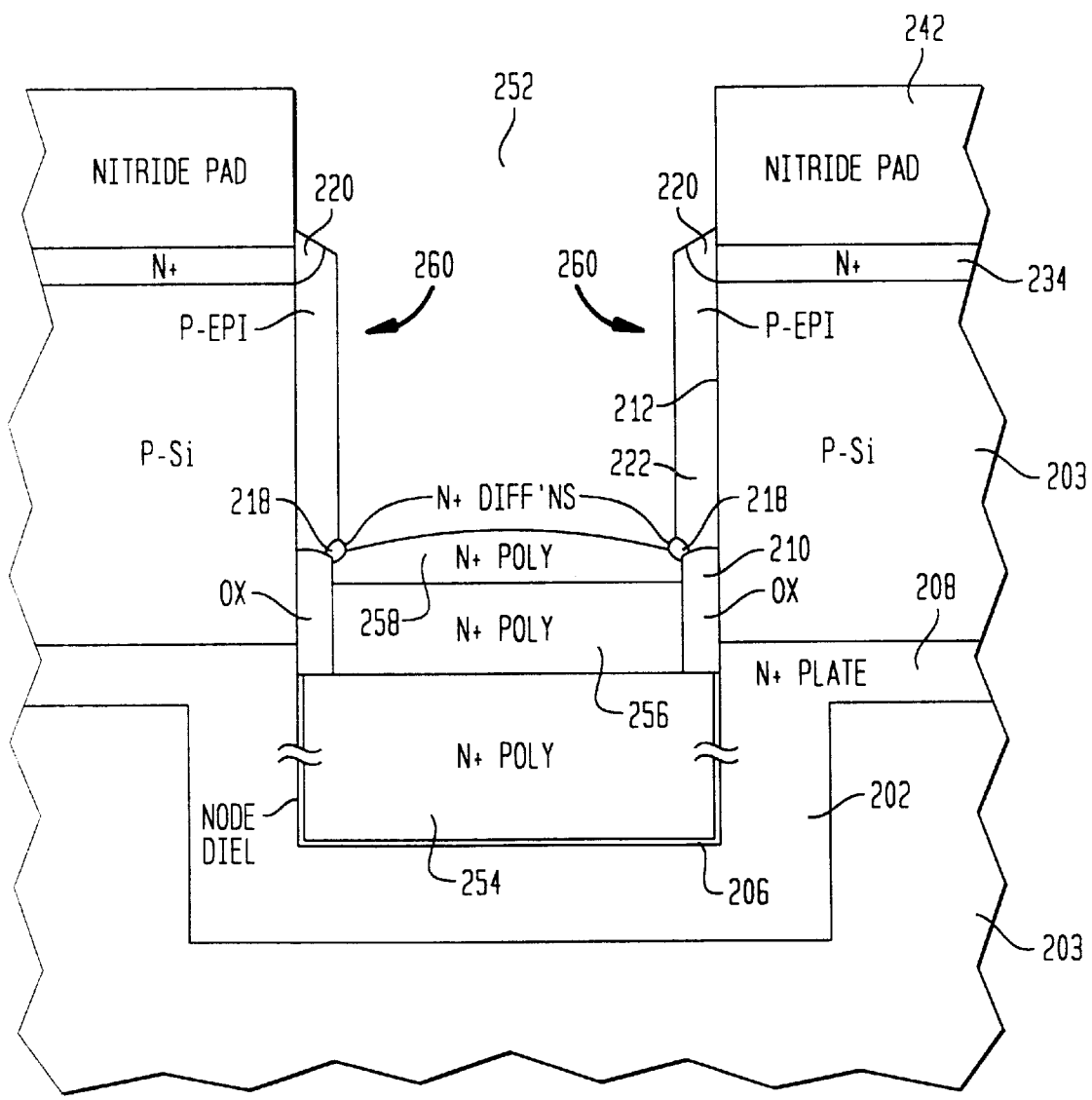

As shown in FIG. 7, selective epitaxial silicon or epi 260 is grown on the exposed side walls 212 of the trench 252. In an exemplary embodiment, the epi 260 is grown using a low temerature epitaxial growth process. During the growth of epi 260 on side walls 212, polysilicon nucleates on the exposed surface of the second conductor 256 to form a third conductor 258. In a preferred embodiment, the epi 260 is deposited essentially intrinsically to enhance its selectivity to non-silicon surfaces.

The epi 260 grown from the side walls 212 of trench 252 obtains its doping by diffusion of a dopant from the substrate 203. For example, for a p-type substrate doped with boron, the boron may diffuse into the epi 260. In an exemplary embodiment, to tailor the doping of the signal transfer region 222, the boron doping in the epi 260 layer may be augmented by an angled implant following the epi 260 growth. Alternatively, the doping of the epi 260 may be augmented by in-situ doping during growth of the epi 260.

In an exemplary embodiment, the doping concentration of the epi 260 is approximately two orders of magnitude less than the doping concentration in the third conductor 258. In an exemplary embodiment, the epi 260 is doped to an impurity concentration range of $1 \times 10^{16}$ to $1 \times 10^{17}$ cm$^{-3}$ and the third conductor 258 has a dopant concentration ranging from $5 \times 10^{19}$ to $1 \times 10^{20}$ cm$^{-3}$. This relationship results in the doping concentration of the third conductor 258 being negligibly affected by dopant introduced into the epi 260. The doping concentration of the third conductor 258 is determined by out-diffusion from the second conductor 256.

The nucleating N+ polysilicon surface of third conductor 258 merges with the epi 260 surface to form a strap between the signal transfer device and the signal storage node. The n-type dopant in the N+ polysilicon surface of third conductor 258 diffuses across the interface between poly-crystalline and mono-crystalline to form the first diffusion region 218. The n-type dopant in the N+ third diffusion region 234 diffuses across the trench side wall 212 to form a second diffusion region 220. The epi 260 between the first and second diffusion regions 218, 220 forms a signal transfer region 222 in which a channel is formed during memory device 200 operation.

Figure 8:
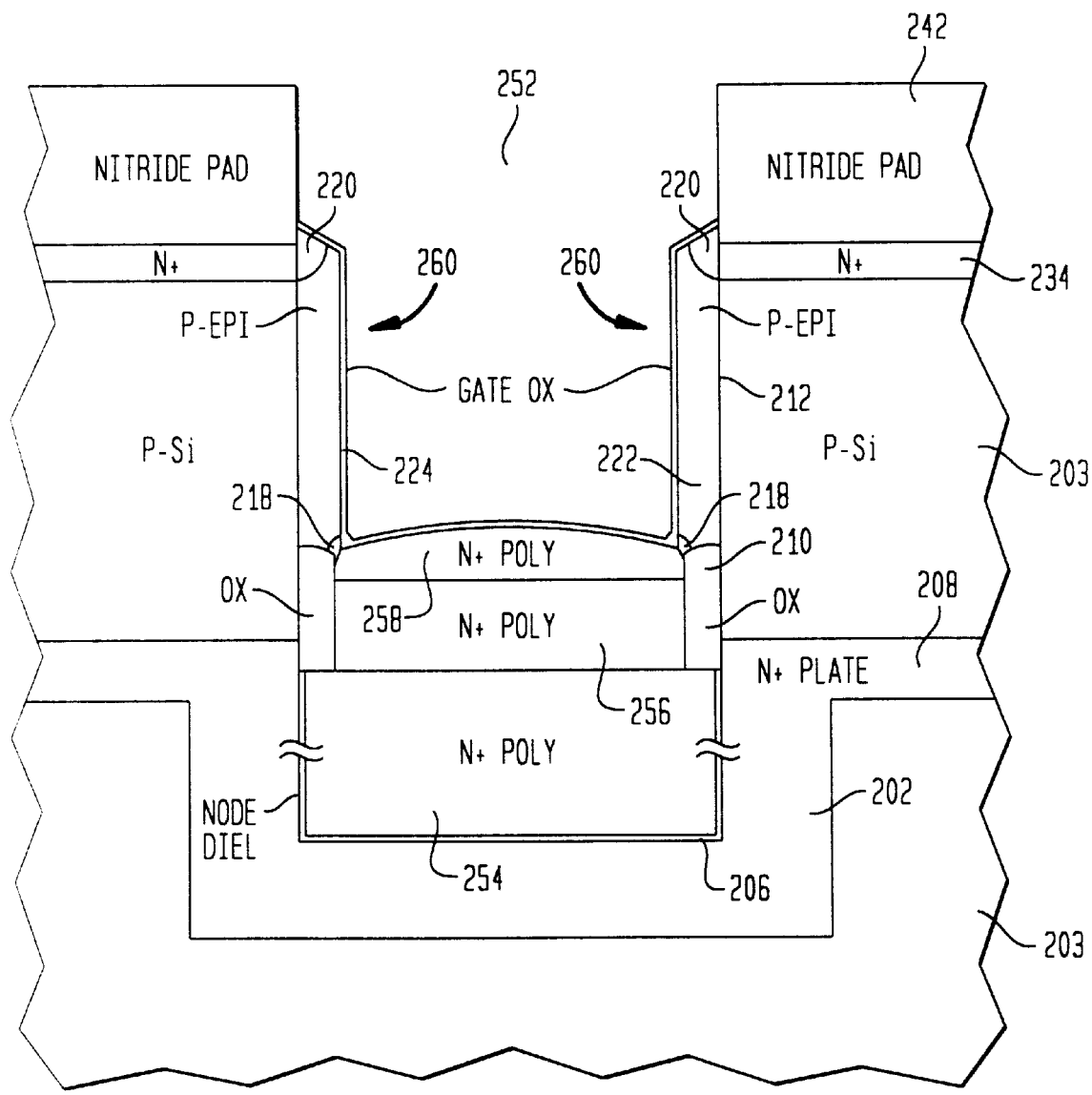

As shown in FIG. 8, the gate insulator 224 is formed upon the first and second diffusion regions 218, 220; the signal transfer region 222; and the third conductor 258. In an exemplary embodiment, the gate insulator 224 is formed by growing an oxide layer. An oxide layer will grow thicker on the third conductor 258 due to its higher doping concentration compared to the first and second diffusion regions 218, 220 and to the signal transfer region 222. Depending on oxidation conditions, the ratio of the thickness of the oxide forming the gate insulator 224 on the third conductor 258 to the thickness of the oxide forming the gate insulator 224 on the epi 260 may be 10:1, for example.

As the oxide thickness of gate insulator 224 on the third conductor 258 increases, isolation between the first gate conductor 226 (subsequently formed) and the third conductor 258 increases and gate capacitance decreases. An even thicker oxide for gate insulator 224 may be formed upon the third conductor 258 by directional deposition, using collimated sputtering or HDP (high density plasma) deposition, for example, of oxide before growing the gate insulator 224. Although directional deposition forms oxide predominantly on horizontal surfaces, an isotropic etch may be used before growing the gate insulator 224 to remove any deposited oxide from the vertical surfaces (such as the epi 260).

Figure 9:
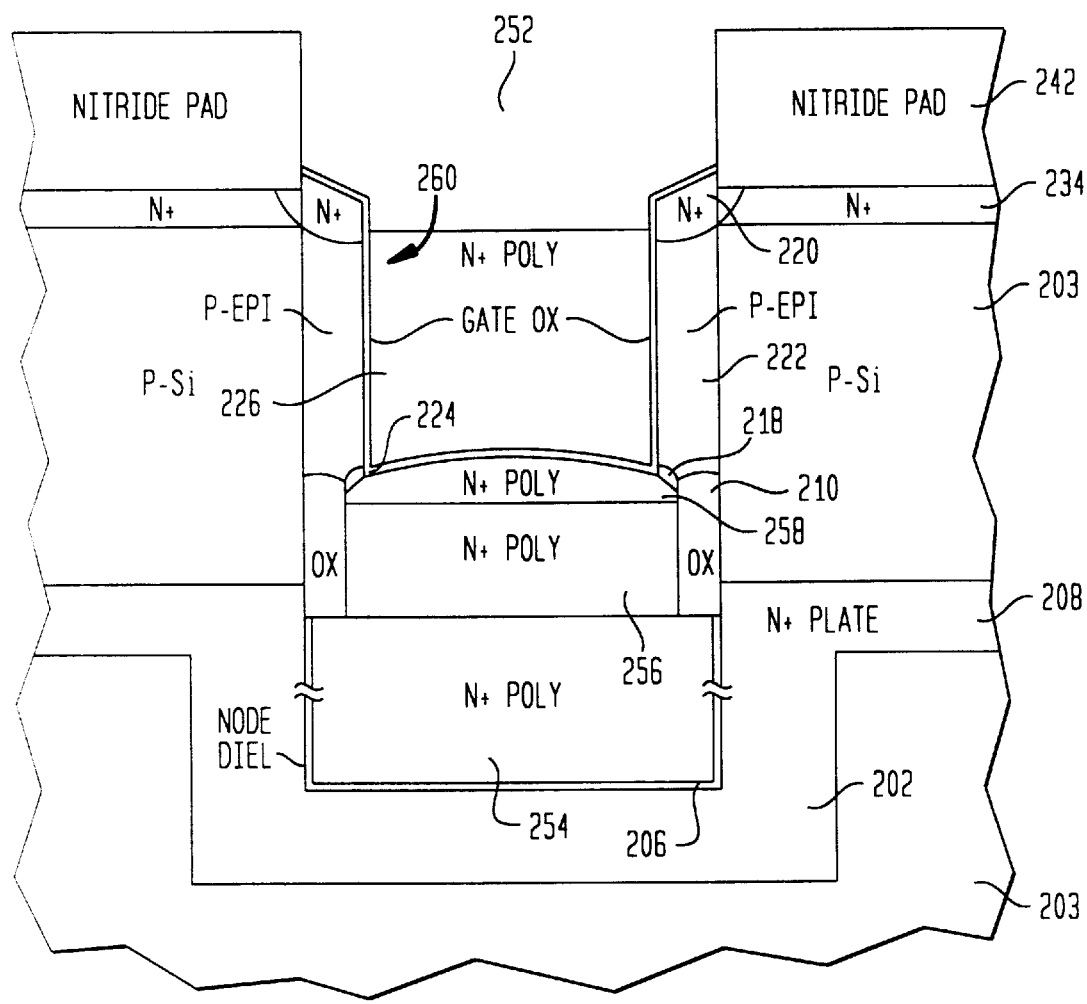

As shown in FIG. 9, the remainder of the trench 252 is filled with a first gate conductor 226 such as N+ polysilicon. The first gate conductor 226 is then planarized and recessed to below the top of the epi 260. An N+ implant is then made into the exposed portion of the epi 260. Regions of the substrate 203 outside of the trenches 252 are masked by the nitride layer 242. This implant further defines the doping of the second diffusion region 220 which will be coupled to the bit line stud conductor 232.

Figure 10:
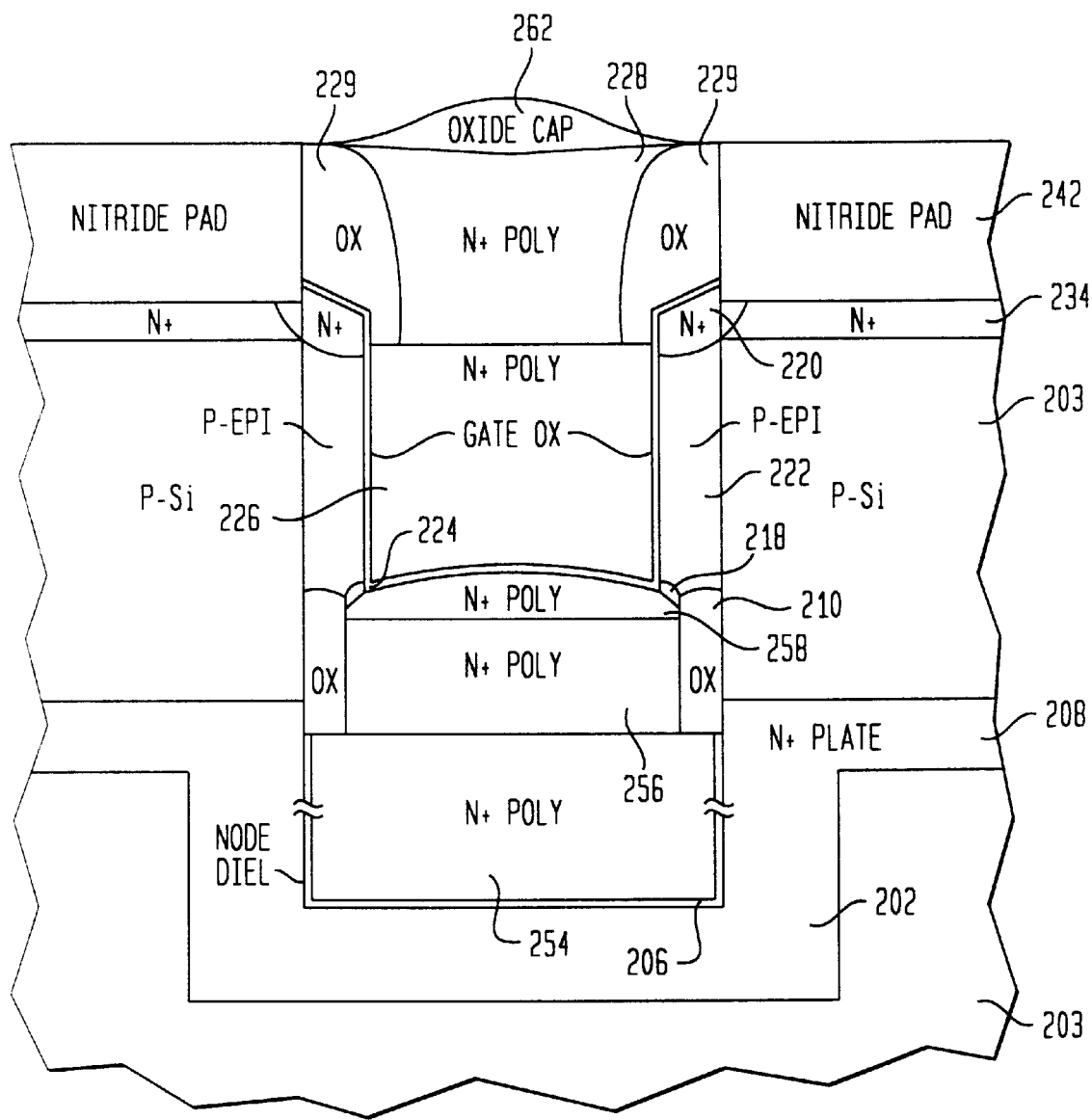

As illustrated in FIG. 10, oxide spacers 229 are formed on the exposed side walls of nitride layer 242 adjacent the exposed epi 260. A second gate conductor 228 such as N+ polysilicon is deposited and planarized to the top of the nitride layer 242. An oxide cap 262 is grown on the exposed second gate conductor 228. Low temperature-high pressure oxidation may be used to form the oxide cap 262 to minimize the thermal budget. The oxide cap 262 protects the second gate conductor 228 in the trench 252 during subsequent etches.

Figure 11:
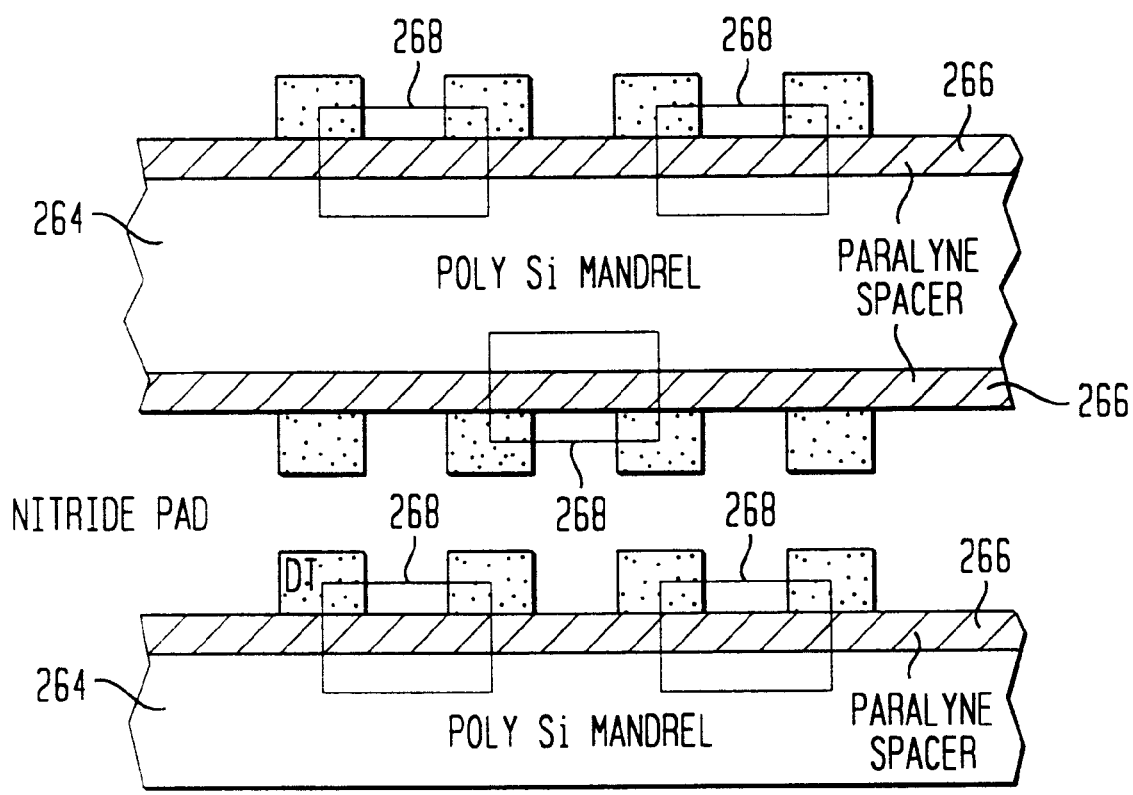
FIGS. 11 and 12 are top views illustrating a process of manufacture according to another exemplary embodiment of the present invention.
Figure 12:
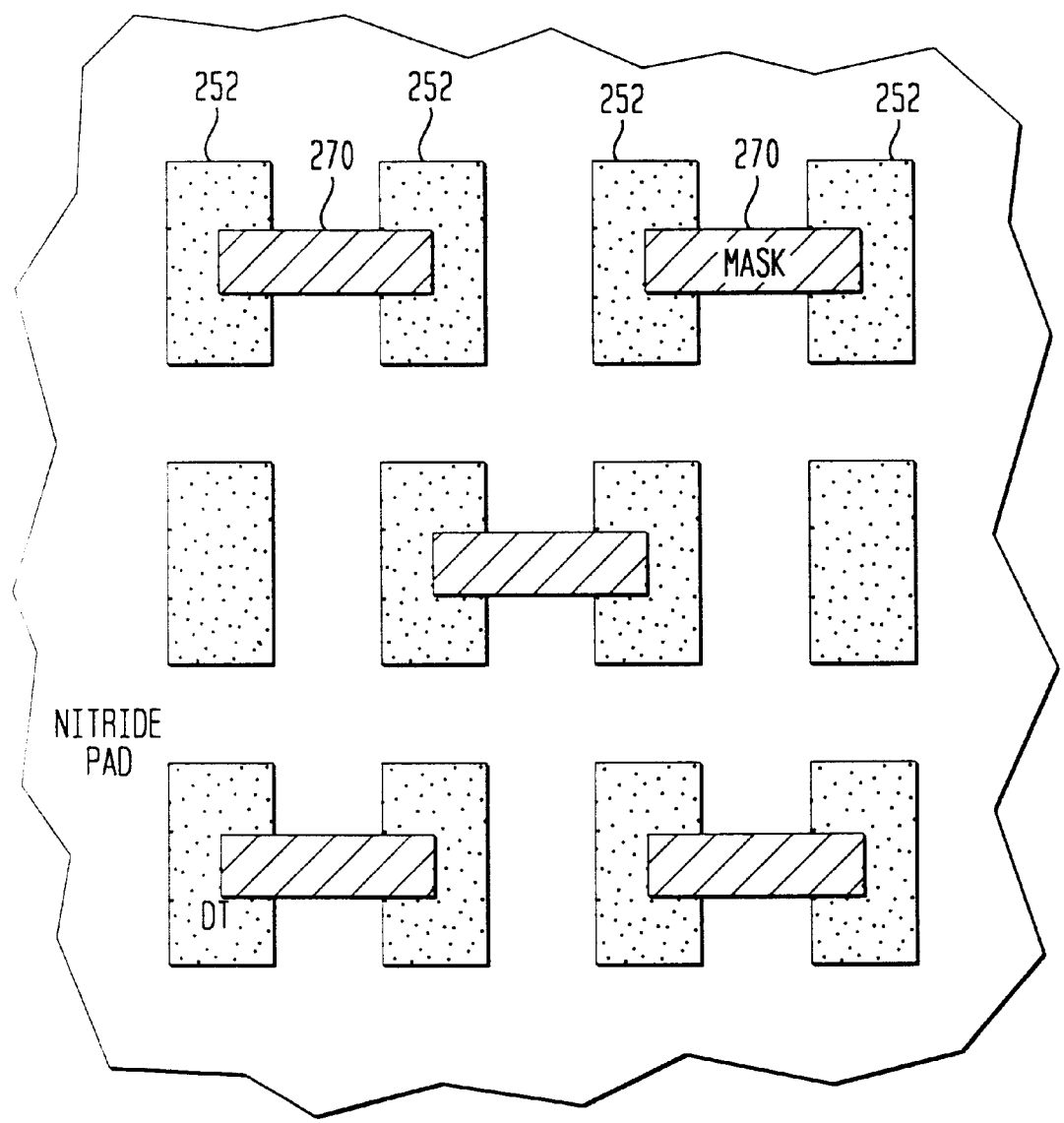
Figure 13:
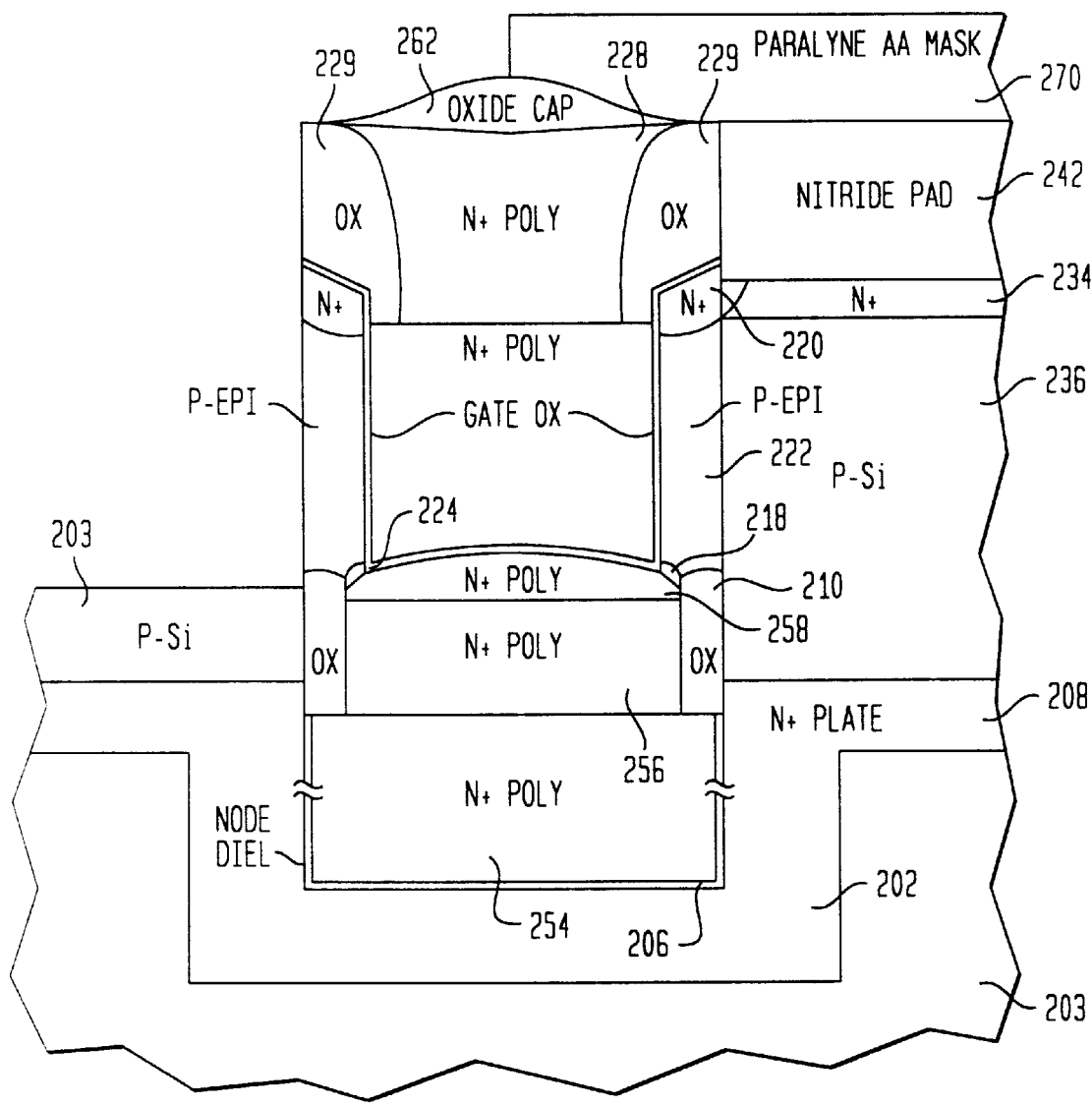

With reference to FIGS. 11–13, formation of a sub-minimum width coupling region 201 (see FIG. 2A) is described. The coupling region 201 does not necessarily have a sub-minimum width and may be varied according to particular device requirements. For example, a narrow width results in a larger percentage of the annular signal transfer region 222 having a lower threshold voltage which allows for a higher current through the signal transfer region. Conversely, a wider width results in a more reliable connection to the conductive connecting member 236 and improved charge transfer efficiency.

A layer of polysilicon is deposited, preferably at a low temperature (500° C. to 700° C., for example), over the substrate and patterned to form stripes 264 as shown in FIG. 11. These polysilicon stripes 264 serve as a mandrel for spacers which define the width of the coupling region 201 and the width of the conductive connecting member 236 (FIG. 2B). Other materials may be used for the mandrel. Preferably, the mandrel material may be etched selective to the subsequent spacer material and the underlying materials.

A layer of paralyne is deposited over the mandrel stripes 264 and reactive ion etched to form spacers 266 on each side of the mandrel stripes 264. The thickness of the spacer 266 and the thickness of the mandrel stripe 264 determine the width of the conductive connecting member 236 and the coupling region 201. The choice of spacer material is not limited to paralyne. Preferably, the spacer material may be formed without damaging the underlying oxide and nitride and can withstand the etches of coupling region 201 for nitride and silicon. Other exemplary spacer materials include polymers such as polyimide and photoresists.

A cut mask 268 or a trim mask is used to protect the spacer 266 from etching wherever it is desired to form coupling regions 201. The cut mask 268 defines portions of the mandrel stripes 264 which contain coupling regions 201.

The mandrel stripe 264 is then removed selective to the spacer 266, oxide and nitride. This removal leaves sub-minimum width lines of spacer 266 forming paralyne masks 270 which define the coupling regions 201 in the array of memory devices 200 as shown in FIG. 12. FIG. 13 illustrates the paralyne mask 270 in a cross-sectional view of the memory device 200.

To use the paralyne mask 270 to define the coupling region 201 in the nitride layer 242, the unprotected nitride layer 242 is etched selective to oxide down to the surface of substrate 203. The oxide cap 262 covers the trench 252; therefore, the net pattern is the union of the paralyne mask 270 and the trench 252. The exposed substrate 203 is etched to a depth slightly below the top of the collar oxide 210.

Figure 14:
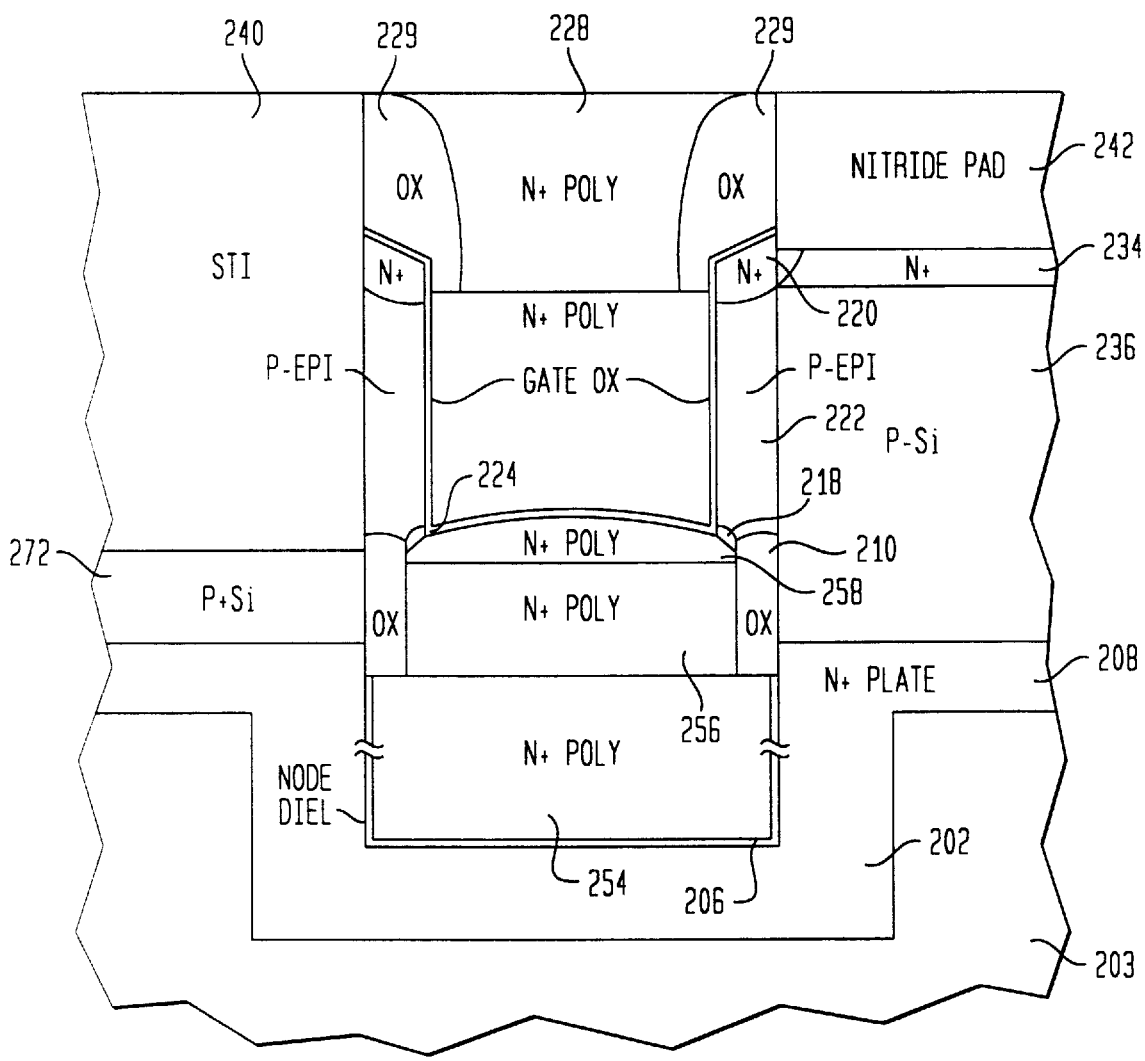

An oxide spacer is formed on the exposed vertical side wall of the silicon for protection from the subsequent P+ implant. The exposed horizontal surfaces of substrate 203 are implanted with a dopant to form the P+ conductive region 272 shown in FIG. 14. This P+ conductive region 272 couples the conductive connecting members 236 to each other and to a reference voltage (not shown). The STI region 240 is then formed above the P+ conductive region 272. The STI region 240 may be formed by CVD or by HDP, for example. After the STI region 240 is deposited, as shown in FIG. 14, the memory device 200 is planarized until the oxide cap 262 (FIG. 13) over the trench 252 is removed and the top surface of the underlying second gate conductor 228 is exposed.

Figure 15:
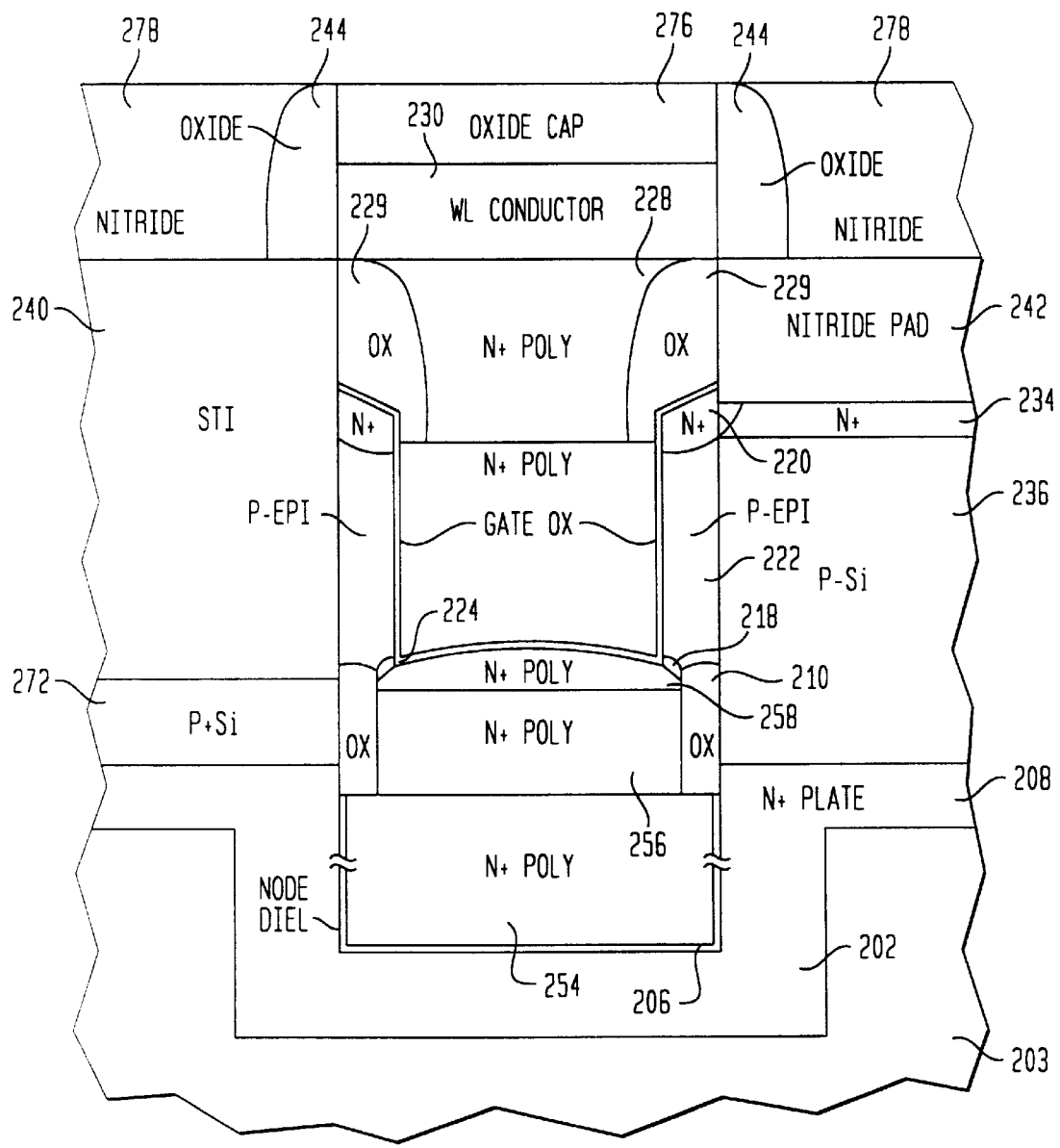

As shown in FIG. 15, a word line stack, including a word line conductor 230 and a word line oxide cap 276, is deposited and patterned. Preferably, the word line stack comprises a highly conductive material, such as a metal or a silicide and an overlying oxide layer. Oxide spacers 244 are formed on the side walls of the word line stack. A layer of nitride 278, preferably silicon nitride, is deposited and planarized to the top of the word line oxide cap 276.

As shown in FIG. 16, a mask 280 is formed for etching a via 282 in which the bit line stud conductor 232 is deposited. The etch is selective to oxide and silicon. After the etch, an n-type dopant is implanted into the via 282 as illustrated by arrows 284. The implant increases the dopant concentration of and increases the size of a central portion of the third diffusion region 234. In an exemplary embodiment, the conductive connecting member 236 is implanted with a p-type dopant such as boron to improve its charge transfer efficiency. The bit line stud conductor 232 is then deposited and planarized to yield the structure shown in FIG. 2B.

The process of manufacture described above provides word line conductors 230 that are self-aligned to the trench 252. This feature allows the spacing between trenches 252 to be minimized while providing sufficient area for the bit line stud conductor 232.

The exemplary process of manufacture may be used to form a signal transfer device which is self-aligned to surrounding isolation. This characteristic allows improved layout density, an increased effective width of the signal transfer device, and elimination of edge parasitics associated with the isolation. In an exemplary embodiment, the bit line contact is borderless to the word lines, thus allowing increased memory device density.

According to an exemplary embodiment of the present invention, a DRAM memory device 200 is provided having a $6F^2$ substrate surface area with a 1F×2F storage capacitor and the capability to scale. The STI region 240 in the exemplary embodiment is referred to as a global collar isolation. The global collar isolation refers to the fact that the isolation region is formed by all areas not included by the union of the coupling region 201 and the trench 252.

Although the trench 252 illustrated in the accompanying drawing has sharp corners, these edges may be rounded—as known to those skilled in the art. Thus, the plural term "side walls" also encompasses the case in which the trench 252 has rounded corners and a single, continuous side wall. A signal transfer device without edges allows for no edge parasitics nor $V_t$ variations due to width and isolation variations.

In an exemplary embodiment, the signal transfer device has a width (W) defined as the circumference around the trench 252 and a length (L) defined as the distance from the first diffusion region 218 to the second diffusion region 220, and the ratio of W:L is greater than 2:1 for a device having a surface area of $6F^2$. In another exemplary embodiment, the ratio of W:L is greater than 5:1.

In an exemplary embodiment, the signal transfer region 222 is doped to an impurity concentration to allow fully depleted operation. Fully depleted operation is easier to achieve because a majority of the first gate conductor 226 is over the portion of the signal transfer region 222 which does not contact the conductive connecting member 236. When operating in a fully depleted mode, the contribution of the ionized impurity charge in the body to $V_t$ is small and either a P+ gate or negative word line low can be used to achieve the desired off-current. Thus, device operation with near ideal sub-$V_t$ slope and negligible substrate sensitivity is possible.

The exemplary embodiment described above is electrically equivalent to a contacted body SOI device. Thus, the device does not have dynamic data retention problems due to floating body effects. For example, in an exemplary embodiment, the potential of the signal transfer region 222 can rapidly equilibrate in about 5 ns following a disturbance.

An exemplary device according to the present invention may operate with negligible $V_t$ sensitivity to channel length variations. This advantage is possible because the length of the signal transfer region 222 formed in the trench 252 is decoupled from the minimum feature size and substrate surface area restrictions. Thus, the device exhibits long channel behavior.

In an exemplary embodiment, the memory device 200 uses a substrate-plate-trench design (SPT). This design avoids limiting the minimum dimension of the trench 252 due to multiple layers as may result in a stacked-in trench design. In an exemplary embodiment, the first and second electrodes 202, 204 of the signal storage node are both n-type silicon. This choice is preferred over using a P+ substrate for the first electrode. 202, which may result in degraded node dielectric reliability due to higher built-in field and due to limited biasing options. To achieve comparable reliability using a P+ substrate for the first electrode 202, the node dielectric 206 must be significantly thickened, which reduces storage capacitance.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A memory device comprising:

a bit line conductor;

a word line conductor;

a substrate having a trench with side walls formed in the substrate;

a signal storage node having a first electrode, a second electrode formed within the trench, and a node dielectric formed between the first and second electrodes; and a signal transfer device comprising:

(i) an annular signal transfer region having an outer surface adjacent the side walls of the trench, an inner surface, a first end, and a second end, (ii) a first diffusion region coupling the first end of the signal transfer region to the second electrode of the signal storage node, (iii) a second diffusion region coupling the second end of the signal transfer region to the bit line conductor, (iv) a gate insulator coating the inner surface of the signal transfer region, and (v) a gate conductor coating the gate insulator and coupled to the word line conductor; and a conductive coupling member coupling a portion of the outer surface of the signal transfer region to a reference potential.

2. The memory device according to claim 1 wherein the first electrode of the signal storage node is formed in the substrate adjacent the trench.

3. The memory device according to claim 1 wherein the first electrode and the second electrode are both comprised of the same one of p-type silicon and n-type silicon.

4. The memory device according to claim 1 wherein the signal transfer region of the signal transfer device is doped to an impurity concentration to operate in a fully depleted mode.

5. The memory device according to claim 1 wherein the first diffusion region of the signal transfer device is interior of the side walls of the trench.

6. The memory device according to claim 1 further comprising an annular collar oxide having an outer surface adjacent the side walls of the trench, an inner surface adjacent an upper portion of the second electrode, a first end adjacent an end of the node dielectric, and a second end adjacent the first end of the signal transfer region, wherein the second electrode comprises polycrystalline silicon, the signal transfer region comprises epitaxial silicon, the second electrode and the signal transfer region merge in a merged region, and the first diffusion region is formed interior of the side walls of the trench in the merged region.

7. The memory device according to claim 1 wherein the signal transfer device has a width defined as a distance around a circumference of the side walls of the trench and a length defined as a distance from the first diffusion region to the second diffusion region and a ratio of width to length greater than 2:1.

8. The memory device according to claim 1 further comprising an oxide isolation region adjacent the outer surface of the signal transfer region.

9. A memory device comprising:
a bit line conductor;
a word line conductor;
a substrate having a trench with side walls formed in the trench;
a signal storage node having a first electrode, a second electrode comprising polycrystalline silicon formed within the trench, and a node dielectric formed between the first and second electrodes;
a signal transfer device comprising:
(i) an annular signal transfer region, comprising epitaxial silicon, having an outer surface adjacent the side walls of the trench, an inner surface, a first end, and a second end,
(ii) a first diffusion region, interior of the side walls of the trench, coupling the first end of the signal transfer region to the second electrode of the signal storage node,
(iii) a second diffusion region coupling the second end of the signal transfer region to the bit line conductor,
(iv) a gate insulator coating the inner surface of the signal transfer region, and
(v) a gate conductor coating the gate insulator and coupled to the word line conductor;
a conductive coupling member coupling a portion of the outer surface of the signal transfer region to a reference potential; and
an annular collar oxide having an outer surface adjacent the side walls of the trench, an inner surface adjacent an upper portion of the second electrode, a first end adjacent an end of the node dielectric, and a second end adjacent the first end of the signal transfer region,
wherein the second electrode and the signal transfer region merge in a merged region, and the first diffusion region is formed in the merged region.

10. The memory device according to claim 9 wherein the signal transfer region of the signal transfer device is doped to an impurity concentration to operate in a fully depleted mode.

11. The memory device according to claim 9 further comprising an oxide isolation region adjacent the outer surface of the signal transfer region exclusive of the portion coupled to the conductive coupling member.

12. An array of memory devices, each memory device comprising:
a bit line conductor;
a word line conductor;
a substrate having a trench with an edgeless side wall formed in the substrate;
a signal storage node having a first electrode formed in the substrate adjacent the trench, a second electrode comprising polycrystalline silicon formed within the trench, and a node dielectric formed between the first and second electrodes, wherein the first and second electrodes are both comprised of the same one of p-type silicon and n-type silicon;
a signal transfer device comprising:
(i) an annular signal transfer region, comprising epitaxial silicon, having an outer surface adjacent the side wall of the trench, an inner surface, a first end, and a second end, wherein the signal transfer region is doped to an impurity concentration to operate in a fully depleted mode,
(ii) a first diffusion region, interior of the side wall of the trench, coupling the first end of the signal transfer region to the second electrode of the signal storage node;
(iii) a second diffusion region coupling the second end of the signal transfer region to the bit line conductor,
(iv) a gate insulator coating the inner surface of the signal transfer region, and
(v) a gate conductor coating the gate insulator and coupled to the word line,
wherein the signal transfer device has a width around the circumference of the side wall of the trench and a length from the first diffusion region to the second diffusion region and a ratio of width to length greater than 2:1;
a conductive coupling member coupling a portion of the outer surface of the signal transfer region to a reference potential and to a signal transfer region of at least one other memory device in the array of memory devices;
an annular collar oxide having an outer surface adjacent the side wall of the trench, an inner surface adjacent an upper portion of the second electrode, a first end adjacent an end of the node dielectric, and a second end adjacent the first end of the signal transfer region,
wherein the second electrode and the signal transfer region merge in a merged region, and the first diffusion region is formed in the merged region; and
an oxide isolation region formed adjacent the outer surface of the signal transfer region exclusive of the portion of the outer surface coupled to the conductive coupling member.

13. A memory device comprising:
a bit line conductor;
a word line conductor;

a p-type silicon substrate having a trench with side walls formed in the substrate;

a signal storage node having an n+ polysilicon first electrode, an n+ polysilicon second electrode formed within the trench, and an oxide node dielectric formed between the first and second electrodes; and a signal transfer device comprising:
   (i) an annular p-type epitaxial silicon signal transfer region having an outer surface adjacent the side walls of the trench, an inner surface, a first end, and a second end,
   (ii) an n+ first diffusion region coupling the first end of the signal transfer region to the second electrode of the signal storage node,
   (iii) an n+ second diffusion region coupling the second end of the signal transfer region to the bit line conductor,
   (iv) an oxide gate insulator coating the inner surface of the signal transfer region,
   (v) a gate conductor coating the gate insulator and coupled to the word line conductor; and a conductive coupling member coupling a portion of the outer surface of the signal transfer region to a reference potential.

* * * * *

UNITED STATES PATENT AND TRADEMARK OFFICE
CERTIFICATE OF CORRECTION

PATENT NO. : 6,144,054
DATED : November 7, 2000
INVENTOR(S) : Farid Agahi et al.

It is certified that error appears in the above-identified patent and that said Letters Patent is hereby corrected as shown below:

Title page,
Item [56], References Cited, U.S. PATENT DOCUMENTS, insert:
-- 4,713,678    12/1987    Womack et al.
   5,365,097    11/1994    Kenney --

Insert -- FOREIGN PATENT DOCUMENTS
01149454    12/1989    Japan --

OTHER PUBLICATIONS, insert:
-- "Vertical Dram Cell Structure Using Vertical Transistor in the Trench Capacitor," IBM Technical Disclosure Bulletin, vol. 33, no. 3A, August 1990 (1990-08), pages 72-75, XP002128296.

"Improved Signal and Density Dynamic Random-Access Memory," IBM Technical Disclosure Bulletin, vol. 31, no. 3, August 1988 (1988-08), pages 279-286, XP000099058. --

Signed and Sealed this

Twelfth Day of February, 2002

Attest:

JAMES E. ROGAN
*Attesting Officer*   *Director of the United States Patent and Trademark Office*